(12) United States Patent
Chen et al.

(10) Patent No.: US 11,501,052 B1
(45) Date of Patent: Nov. 15, 2022

(54) CONDUCTOR SCHEME SELECTION AND TRACK PLANNING FOR MIXED-DIAGONAL-MANHATTAN ROUTING

(71) Applicant: Taiwan Semiconductor Manufacturing Company, Ltd., Hsinchu (TW)

(72) Inventors: Sheng-Hsiung Chen, Zhubei (TW); Huang-Yu Chen, Hsinchu (TW); Chung-Hsing Wang, Hsinchu (TW); Jerry Chang Jui Kao, Taipei (TW)

(73) Assignee: Taiwan Semiconductor Manufacturing Company, Ltd, Hsinchu (TW)

( * ) Notice: Subject to any disclaimer, the term of this patent is extended or adjusted under 35 U.S.C. 154(b) by 0 days.

(21) Appl. No.: 17/331,693

(22) Filed: May 27, 2021

(51) Int. Cl.
  *G06F 30/00* (2020.01)
  *G06F 30/3947* (2020.01)
  *G06F 30/39* (2020.01)

(52) U.S. Cl.
  CPC .......... *G06F 30/3947* (2020.01); *G06F 30/39* (2020.01)

(58) Field of Classification Search
  CPC .............................. G06F 30/3947; G06F 30/39
  See application file for complete search history.

(56) References Cited

U.S. PATENT DOCUMENTS

| | | | | |
|---|---|---|---|---|
| 6,858,939 B1 * | 2/2005 | Teig | ..................... | H01L 23/528 257/777 |
| 7,003,748 B1 * | 2/2006 | Hsu | ........................ | G06F 30/394 716/120 |
| 7,328,422 B2 * | 2/2008 | Ito | ........................ | G06F 30/392 716/113 |
| 7,412,682 B2 * | 8/2008 | Malhotra | .............. | G06F 30/394 716/106 |
| 7,594,196 B2 * | 9/2009 | Hetzel | ..................... | G06F 30/39 716/126 |
| 7,622,779 B2 * | 11/2009 | Cheng | ................. | G06F 15/8023 257/776 |

FOREIGN PATENT DOCUMENTS

| | | | | |
|---|---|---|---|---|
| CN | 107209792 A | * | 9/2017 | ......... G06F 17/5077 |
| CN | 107247844 A | * | 10/2017 | ............. G06F 30/30 |
| CN | 107832519 A | * | 3/2018 | ........... G06F 30/392 |
| JP | H09319789 A | * | 12/1997 | |
| JP | 2007535715 A | * | 12/2007 | |
| JP | 4031905 B2 | * | 1/2008 | ......... G06F 17/5045 |
| JP | 4880151 B2 | * | 2/2012 | ....... H01L 21/76838 |
| TW | 564359 B | * | 12/2003 | |

* cited by examiner

*Primary Examiner* — Naum Levin
(74) *Attorney, Agent, or Firm* — Merchant & Gould P.C.

(57) ABSTRACT

The routing of conductors in the conductor layers in an integrated circuit are routed using mixed-Manhattan-diagonal routing. Various techniques are disclosed for selecting a conductor scheme for the integrated circuit prior to fabrication of the integrated circuit. Techniques are also disclosed for determining the supply and/or the demand for the edges in the mixed-Manhattan-diagonal routing.

20 Claims, 25 Drawing Sheets

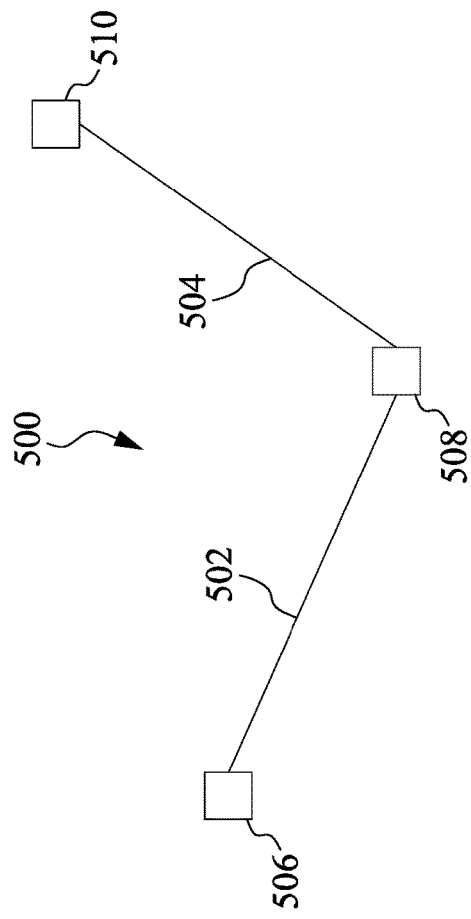 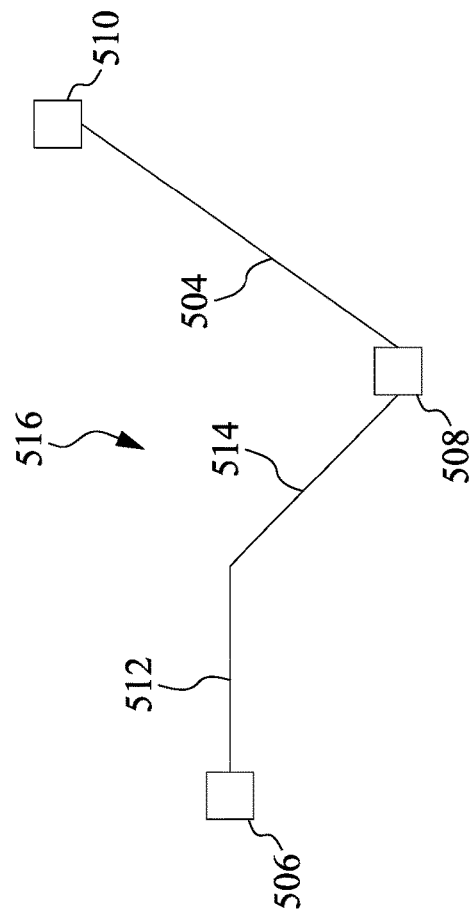

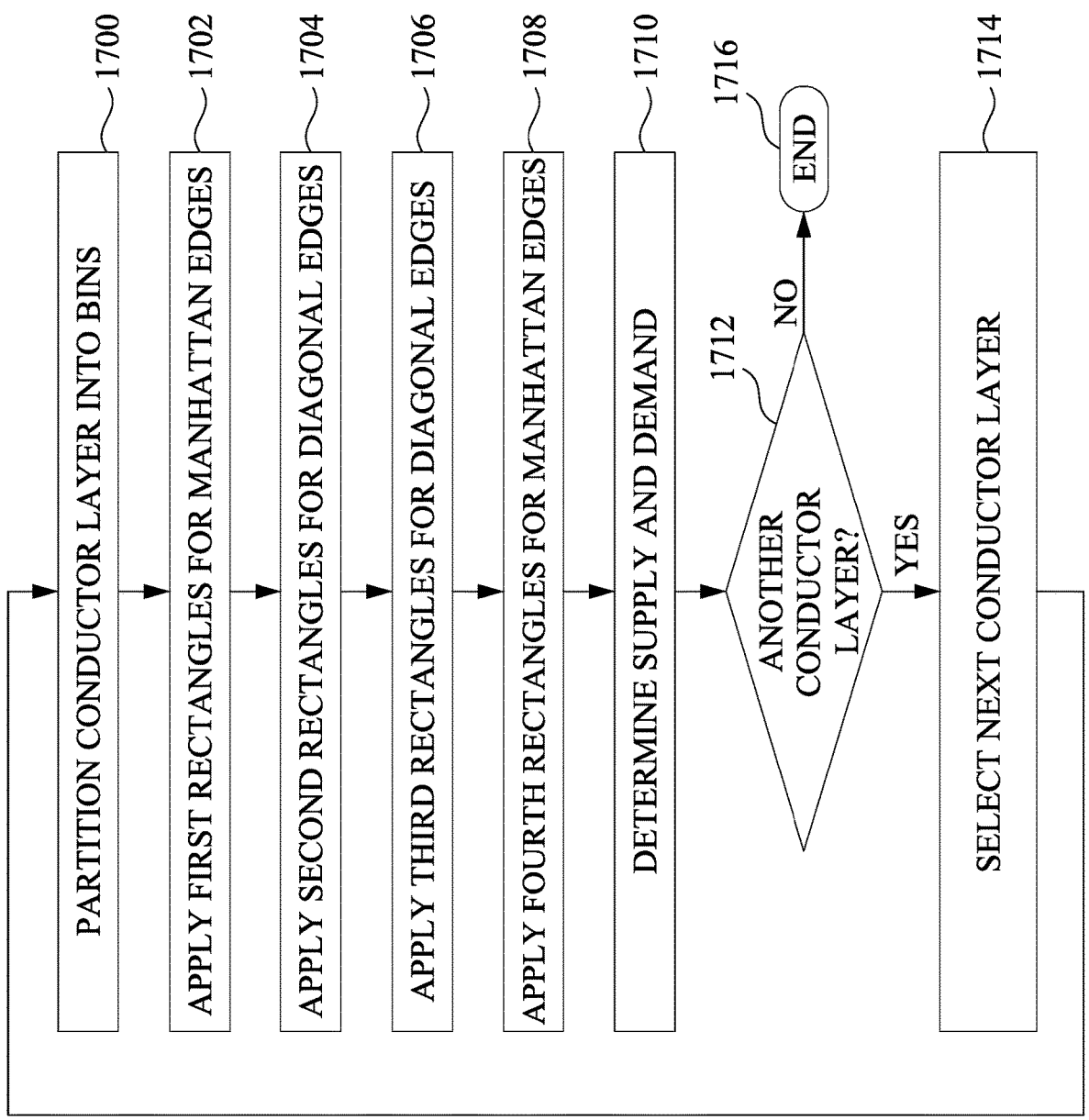

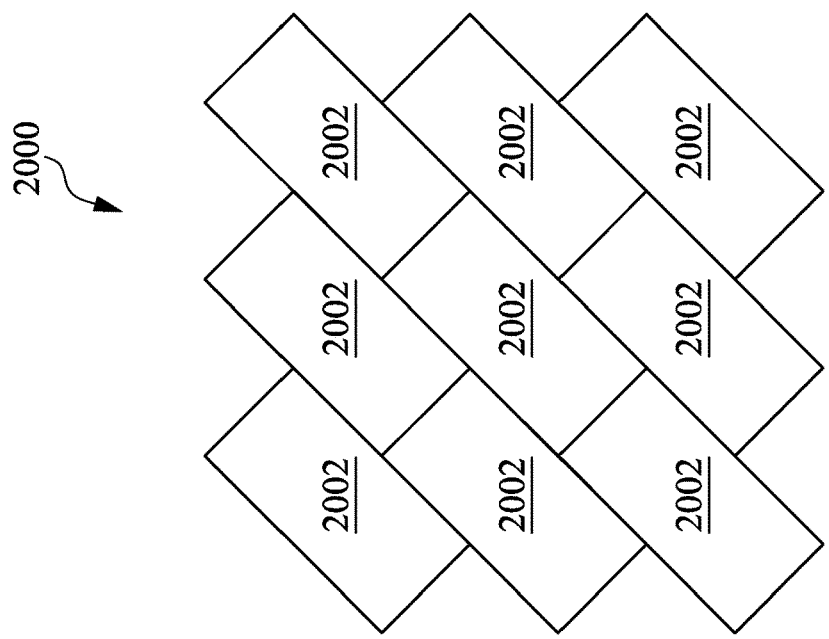
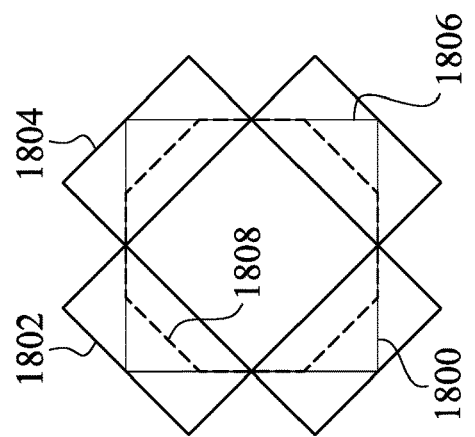
Fig. 20
Fig. 19
Fig. 18

CONDUCTOR SCHEME SELECTION AND TRACK PLANNING FOR MIXED-DIAGONAL-MANHATTAN ROUTING

BACKGROUND

An integrated circuit includes a substrate, one or more circuits above the substrate, and metal lines that interconnect the components of a circuit and/or interconnect one circuit to another circuit. Prior to fabrication of the semiconductor device, a layout of the metal conductors in the integrated circuit is created. The metal conductors route signals and power or voltage sources to the components in the integrated circuit. The metal conductors that route voltage sources are part of a power delivery network that distributes one or more voltages to the active components in the integrated circuit. Conventional layouts of the metal conductors do not always route the signals and the voltage sources efficiently.

BRIEF DESCRIPTION OF THE DRAWINGS

Aspects of the present disclosure are best understood by the following detailed description in conjunction with the accompanying drawings, where like reference numerals designate like structural elements. It is noted that various features in the drawings are not drawn to scale. In fact, the dimensions of the various features may be arbitrarily increased or reduced for clarity of discussion.

FIG. 5A depicts a minimum spanning tree for a net in accordance with some embodiments;

FIG. 5B illustrates an edge in the minimum spanning tree shown in FIG. 5A decomposed into a Manhattan edge and a diagonal edge in accordance with some embodiments;

FIG. 17 depicts a flowchart of an example method of determining supply and demand in a 3D global routing process in accordance with some embodiments;

FIG. 18 illustrates an example first, second, third, and fourth rectangles for an octagon-shaped bin associated with a conductor layer in accordance with some embodiments;

FIG. 19 depicts an example layout of first rectangles that can be used in 3D global routing in accordance with some embodiments;

FIG. 20 illustrates an example layout of second rectangles that can be used in 3D global routing in accordance with some embodiments;

DETAILED DESCRIPTION

Figure 1:
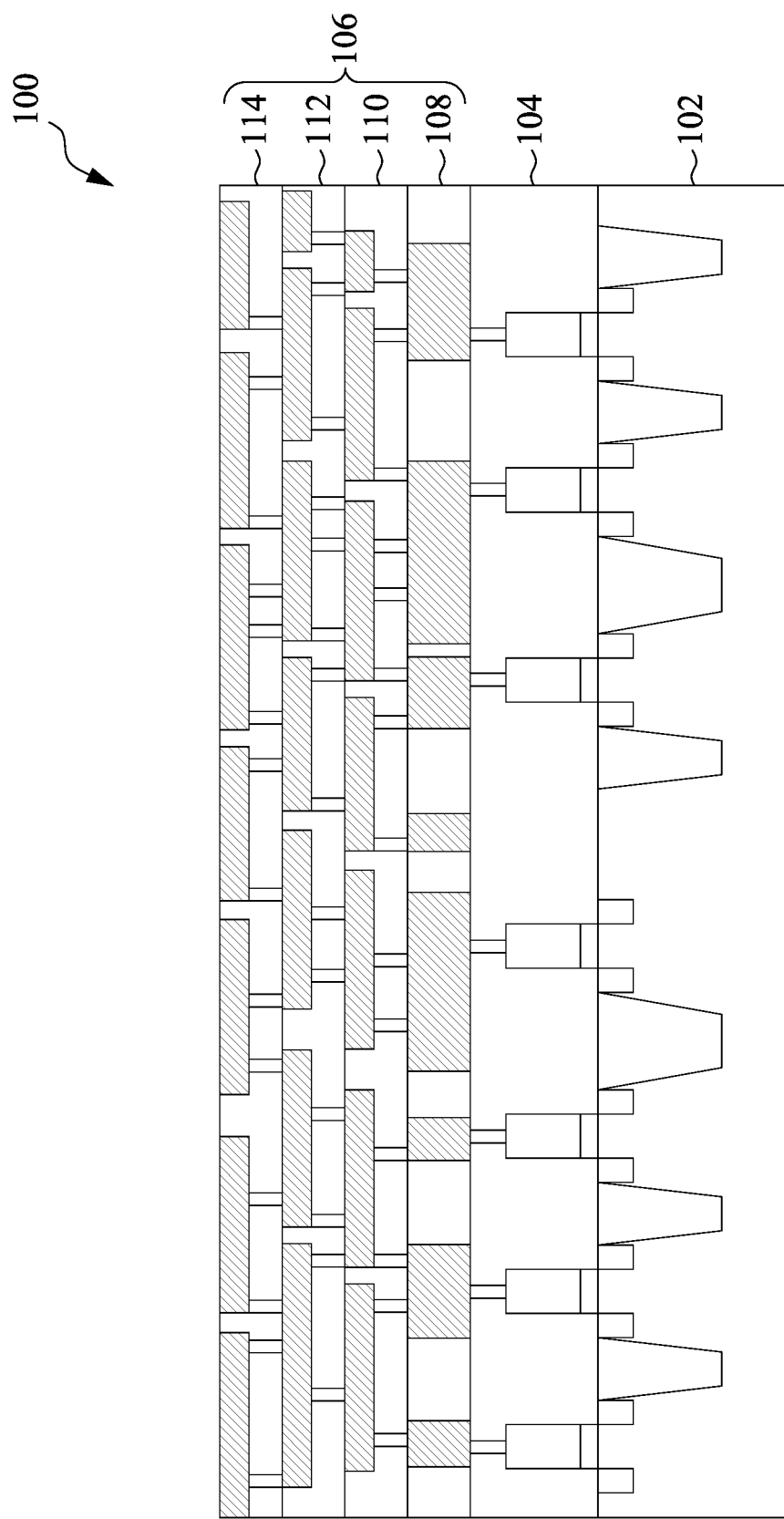
FIG. 1 depicts a cross-sectional view of an example integrated circuit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "under", "upper," "top," "bottom," "front," "back," and the like, may be used herein for ease of description to describe one element or feature's relationship to another element(s) or feature(s) as illustrated in the Figure(s). The spatially relative terms are intended to encompass different orientations of the device in use or operation in addition to the orientation depicted in the figures. Because components in various embodiments can be positioned in a number of different orientations, the directional terminology is used for purposes of illustration only and is in no way limiting. When used in conjunction with layers of an integrated circuit, semiconductor device, or electronic device, the directional terminology is intended to be construed broadly, and therefore should not be interpreted to preclude the presence of one or more intervening layers or other intervening features or elements. Thus, a given layer that is described herein as being formed on, over, or under, or disposed on, over, or under another layer may be separated from the latter layer by one or more additional layers.

Integrated circuits are commonly used in various electronic devices. Integrated circuits include circuits that provide or contribute to the functionality or functionalities of the integrated circuit. Non-limiting example circuits are logic components such as a flip flop, latch, inverter, NAND, OR, AND, and NOR circuits, as well as amplifiers, buffers, and transistors. Conductive interconnects, such as conductors made of one or more conductive materials, are commonly used to route signals and voltage sources to and from the circuits (or contact pads associated with the circuits). Conventional routing schemes for the conductors, known as Manhattan routing, route the conductors orthogonally with respect to a design boundary. In a non-limiting example, the design boundary is the edges of a chip or die of the integrated circuit. However, in some instances, the orthogonal routing is not the shortest distance between two components. Embodiments disclosed herein provide various techniques for selecting a conductor scheme (e.g., a metal scheme) and planning the tracks for the conductor scheme in mixed-diagonal-Manhattan routing. A track represents a path or a route for a conductor in an integrated circuit, such as a route for a metal line.

These and other embodiments are discussed below with reference to FIGS. 1-28. However, those skilled in the art will readily appreciate that the detailed description given herein with respect to these Figures is for explanatory purposes only and should not be construed as limiting.

FIG. 1 depicts a cross-sectional view of an example integrated circuit in accordance with some embodiments. The integrated circuit 100 includes a substrate 102, a circuit 104, and an interconnect structure 106. The substrate 102 is implemented with any suitable substrate. For example, the substrate 102 can be a semiconductor substrate, a gallium nitride substrate, or a silicon carbide substrate.

The circuit 104 is disposed in, on and/or above the substrate 102 and can include passive and/or active components. Example circuits include, but are not limited to, a NAND circuit, a NOR circuit, an inverter, a flip flop, a latch, an amplifier, a resistor, a capacitor, a transistor, a diode, or combinations thereof.

The interconnect structure 106 includes conductor layers 108, 110, 112, 114 (e.g., M0-M3 metal layers) that are arranged sequentially above the circuit 104. Each conductor layer 108, 110, 112, 114 includes conductors that interconnect a component of the circuit 104 to another component of the circuit 104 and/or to one or more power sources (e.g., VDD and VSS). The conductors can be made of any suitable conductive material or materials, such as metal. In one embodiment, the conductors in at least one conductor layer are implemented as metal lines. Additionally or alternatively, the conductors in at least one conductor layer are configured as metal pillars. Although FIG. 1 presents four conductor layers 108, 110, 112, 114 and one circuit 104, other embodiments can include any number of conductor layers and/or any number of circuits.

In some embodiments, octilinear Steiner trees are generated for all of the nets in the integrated circuit and used to select a conductor scheme for the integrated circuit. An octilinear Steiner tree is composed of horizontal, vertical, and/or diagonal lines that represent the connections between the input(s) pins and the output(s) pins of each net. An octilinear Steiner tree depicts a route (e.g., a minimum route) that can be used to connect the input(s) pins and the output(s) pins of a net. However, other embodiments are not limited to the use of an octilinear Steiner tree. Any suitable type of tree or other representation of a net may be used to diagram the nets in an integrated circuit. In one non-limiting example, minimum spanning trees may be used.

Figure 2:
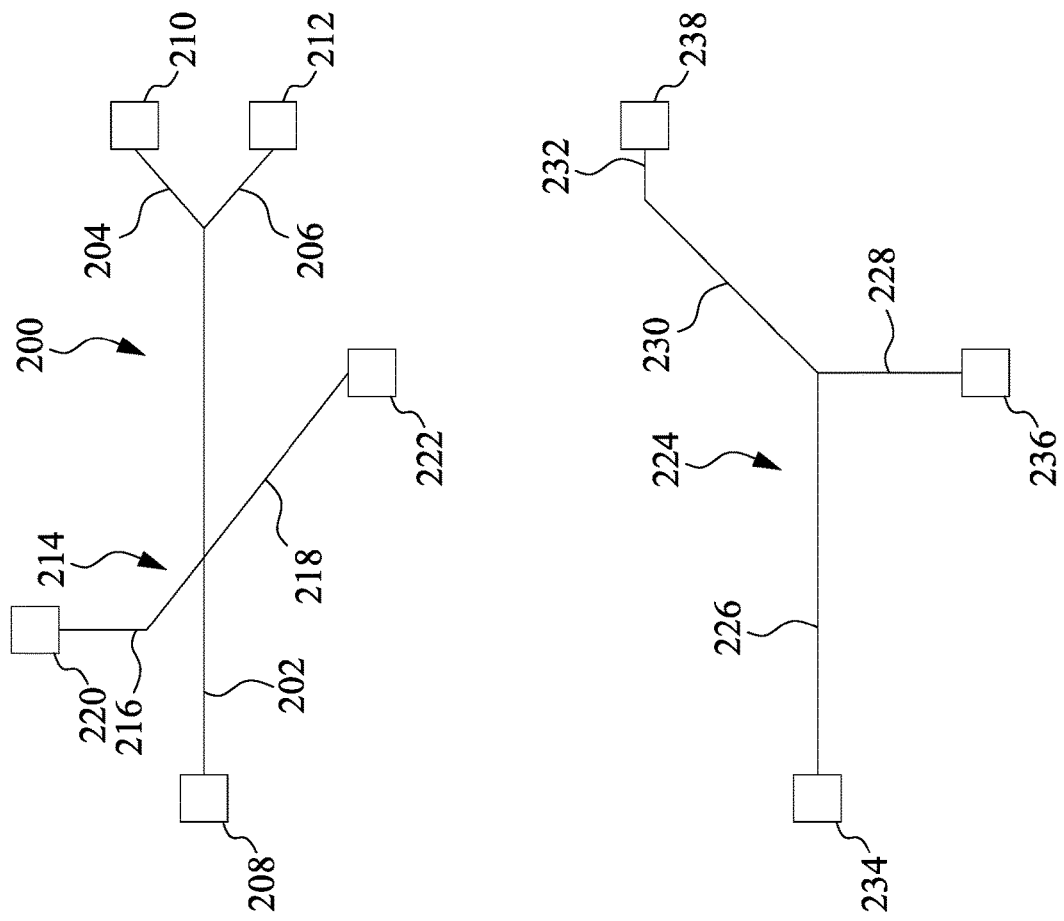
FIG. 2 illustrates example octilinear Steiner trees for three nets in an integrated circuit in accordance with some embodiments.

FIG. 2 illustrates example octilinear Steiner trees for three nets in an integrated circuit in accordance with some embodiments. Although three octilinear Steiner trees are shown, any number of octilinear Steiner trees may be produced for an integrated circuit. The octilinear Steiner tree 200 includes three edges 202, 204, 206 and three pins 208, 210, 212. Each edge 202, 204, 206 represents a connection between two pins 208, 210, 212, and a pin portrays an input pin or an output pin of the net. In the illustrated embodiment, edge 202 is a horizontal edge and edges 204, 206 are diagonal edges.

The octilinear Steiner tree 214 includes two edges 216, 218 and two pins 220, 222. Edge 216 is a vertical edge and edge 218 is a diagonal edge. The octilinear Steiner tree 224 includes four edges 226, 228, 230, 232 and three pins 234, 236, 238. In the illustrated embodiment, edge 228 is a vertical edge, edges 226, 232 are horizontal edges, and edge 230 is a diagonal edge. As will be described in more detail in conjunction with FIGS. 3 and 4, the orientation of the edges and the number of edges or the length of the edges are considered when selecting a conductor scheme for an integrated circuit.

Figure 3:
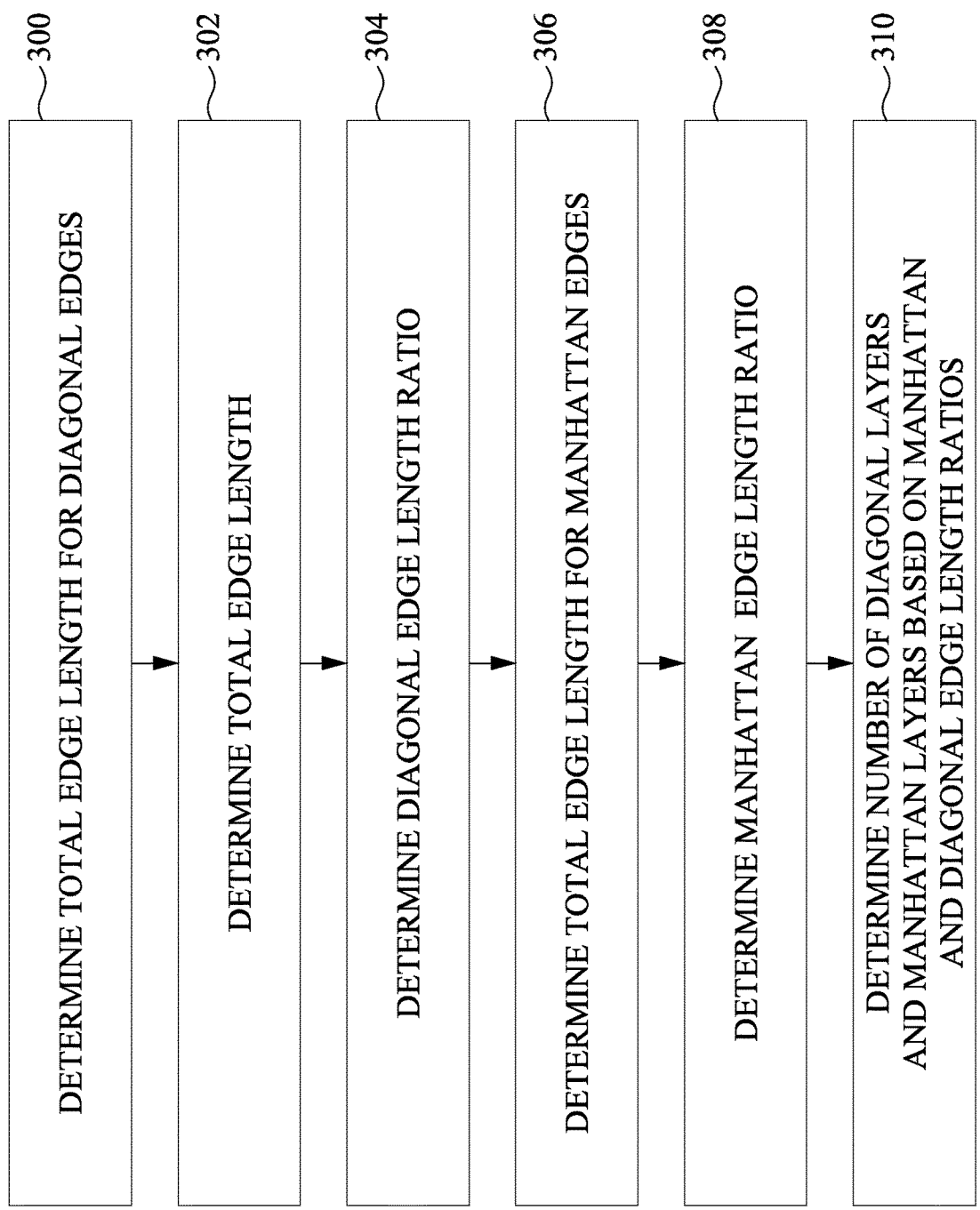
FIG. 3 depicts a flowchart of an example first method of determining a number of conductor layers for diagonal and Manhattan routing in accordance with some embodiments.

FIG. 3 depicts a flowchart of an example first method of determining a number of conductor layers for diagonal and Manhattan routing in accordance with some embodiments. In general, the number of diagonal layers to be used in an integrated circuit is based on a diagonal edge length ratio, and the number of Manhattan layers is based on a Manhattan edge length ratio. In one embodiment, the diagonal edges include the edges oriented at forty-five (45) degrees and at one hundred and thirty-five (135) degrees with respect to a design boundary, and the Manhattan edges include the vertical and the horizontal edges (edges oriented at ninety (90) degrees and zero (0) degrees, respectively, with respect to the design boundary).

Initially, as shown in block 300, a total edge length for the diagonal edges (a "total diagonal edge length") is determined. For example, in FIG. 2, the lengths of the diagonal edges 204, 206, 218, 230 are summed to produce the total edge length for the diagonal edges. Next, as shown in block 302, a total edge length is determined. The total edge length is calculated by summing the lengths of all of the Manhattan and diagonal edges in the trees (e.g., the octilinear Steiner trees). With respect to FIG. 2, the lengths of the edges 202, 204, 206, 216, 218, 226, 228, 230, 232 are summed to determine the total edge length at block 302.

The diagonal edge length ratio is then calculated at block 304. In a non-limiting embodiment, Equation 1 is used to determine the diagonal edge length ratio:

$$\text{Diagonal Edge Length Ratio } (d\ \%) = \frac{\text{Total Diagonal Edge Length}}{\text{Total Edge Length}} \quad \text{Equation 1}$$

The process continues at block 306 where the total edge length for the Manhattan edges (a "total Manhattan edge length") is calculated. As noted earlier, the Manhattan edges are the vertical and the horizontal edges in the trees (e.g., the octilinear Steiner trees). For example, in FIG. 2, the lengths of the Manhattan edges 202, 216, 226, 228, 232 are summed to produce the total edge length for the Manhattan edges.

The Manhattan edge length ratio is then calculated at block 308. In a non-limiting embodiment, Equation 2 is used to determine the Manhattan edge length ratio:

$$\text{Manhattan Edge Length Ratio } (m\ \%) = \frac{\text{Total Manhattan Edge Length}}{\text{Total Edge Length}} \quad \text{Equation 2}$$

The number of diagonal layers and the number of Manhattan layers are determined at block 310 based on the diagonal edge length ratio and the Manhattan edge length ratio. In one embodiment, assuming an integrated circuit will include n conductor layers, where n is a number greater than one, the number of the n conductor layers that is assigned to Manhattan routing (e.g., the Manhattan layer number or MLN) is MLN=n×m %. The MLN includes a number of conductor layers assigned to vertical routings and a number of conductor layers assigned to horizontal routings.

The number of the n conductor layers that is assigned to diagonal routing (e.g., the diagonal layer number or DLN) is DLN=n×d %. The DLN includes the number of conductor layers assigned to forty-five (45) degree routing and the number of conductor layers assigned to one hundred and thirty-five (135) degree routings. In one embodiment, the MLN is divided by two to provide a number of conductor layers assigned to horizontal routings and a number of conductor layers assigned to vertical routings. Additionally or alternatively, the DLN is divided by two to calculate the number of conductor layers that is assigned to forty-five (45) degree routing and the number of conductor layers assigned to one hundred and thirty-five (135) degree routings.

Figure 4:
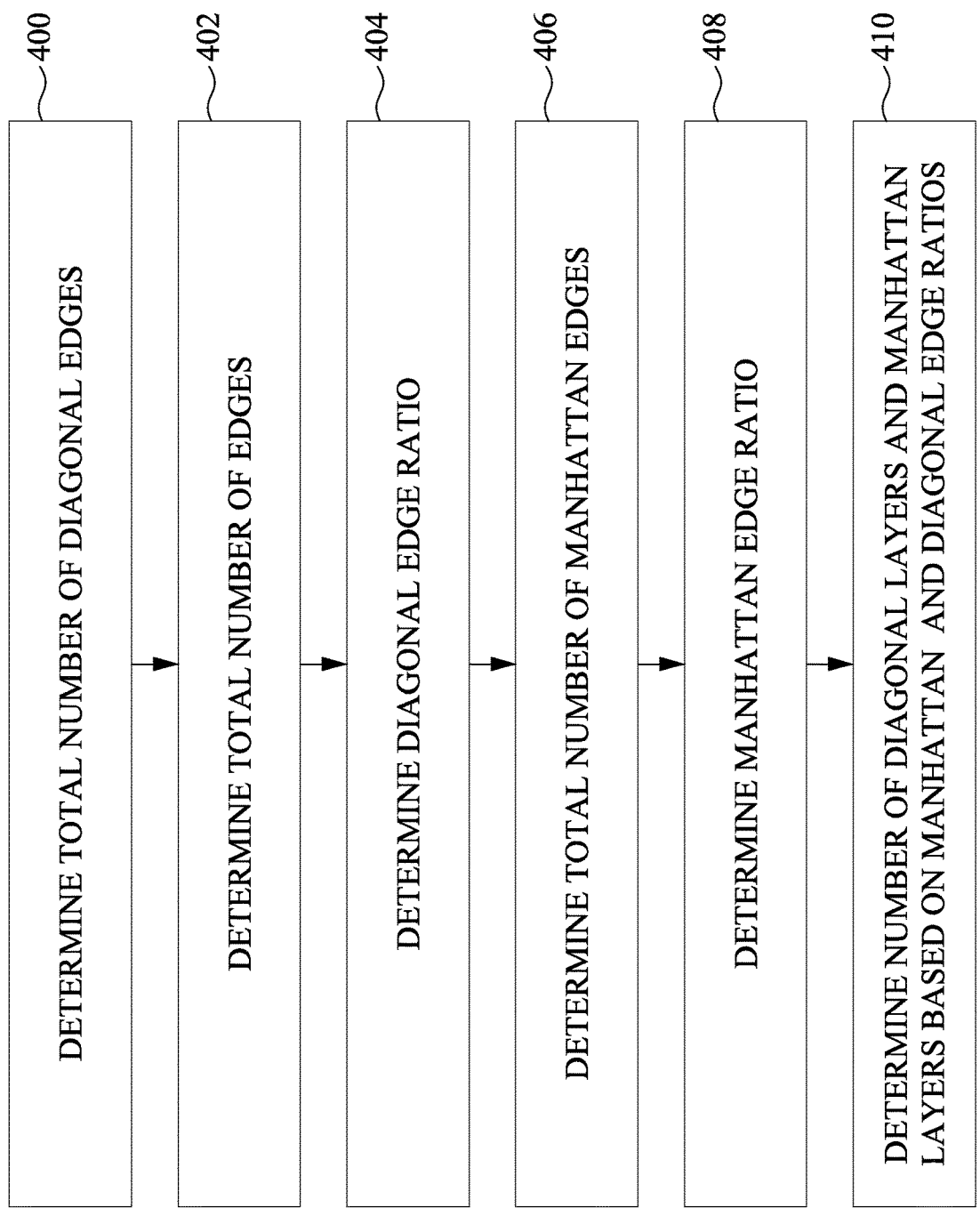
FIG. 4 illustrates a flowchart of an example second method of determining a number of conductor layers for diagonal and Manhattan routing in accordance with some embodiments.

FIG. 4 illustrates a flowchart of an example second method of determining a number of conductor layers for diagonal and Manhattan routing in accordance with some embodiments. The process shown in FIG. 4 is similar to the method of FIG. 3 except that a total number of edges is used in place of a sum of edge lengths. Initially, as shown in block 400, a count (e.g., a total number) of diagonal edges is determined (a "total diagonal edges"). For example, in FIG. 2, the total number of diagonal edges 204, 206, 218, 230 is four (4).

Next, as shown in block 402, a total number of edges is determined (a "total edges"). The total number of edges is calculated by counting the number of Manhattan edges and the number of diagonal edges in the trees (e.g., the octilinear Steiner trees). With respect to FIG. 2, the total number of edges 202, 204, 206, 216, 218, 226, 228, 230, 232 is nine (9).

The diagonal edge ratio is then calculated at block 404. In a non-limiting embodiment, Equation 3 is used to determine the diagonal edge ratio:

$$\text{Diagonal Edge Ratio } (d\ \%) = \frac{\text{Total Diagonal Edges}}{\text{Total Edges}} \quad \text{Equation 3}$$

The process continues at block 406 where the total number of Manhattan edges is calculated (a "total Manhattan edges"). For example, in FIG. 2, the total number of Manhattan edges 202, 216, 226, 228, 232 is five (5). The Manhattan edge ratio is then calculated at block 408. In a non-limiting embodiment, Equation 4 is used to determine the Manhattan edge ratio:

$$\text{Manhattan Edge Ratio } (m\ \%) = \frac{\text{Total Manhattan Edges}}{\text{Total Edges}} \quad \text{Equation 4}$$

The number of diagonal layers and the number of Manhattan layers are determined at block 410 based on the diagonal edge ratio and the Manhattan edge ratio. In one embodiment, assuming an integrated circuit will include n conductor layers, where n is a number greater than one, the number of the n conductor layers assigned to Manhattan routing (e.g., the Manhattan layer number or MLN) is MLN=n×m %. The MLN includes a number of conductor layers that is assigned to vertical routings and a number of conductor layers that is assigned to horizontal routings.

The number of the n conductor layers that is assigned to diagonal routing (e.g., the diagonal layer number or DLN) is DLN=n×d %. In one embodiment, the DLN includes the number of conductor layers assigned to forty-five (45) degree routing and the number of conductor layers assigned to one hundred and thirty-five (135) degree routings. In one embodiment, the MLN and/or the DLN is divided by two to provide a number of conductor layers assigned to each type of routing (e.g., horizontal, vertical, forty-five (45) degree, 135 degree).

In other embodiments, the blocks shown in FIGS. 3 and 4 can be arranged in a different order and/or one or more blocks may be omitted or added. For example, block 302 in FIG. 3 can be performed before block 300. Additionally or alternatively, blocks 406 and 408 shown in FIG. 4 can occur before block 400.

In some embodiments, a tree other than an octilinear Steiner tree is used in the DLN and MLN calculations. FIG. 5A depicts a minimum spanning tree for a net in accordance with some embodiments. The minimum spanning tree 500 includes two edges 502, 504 and three pins 506, 508, 510. In the illustrated embodiment, edge 502 is neither a forty-five (45) degree diagonal edge nor a one hundred and thirty-five (135) degree diagonal edge, and edge 504 is a forty-five degree (45) diagonal edge.

To calculate the Manhattan edge ratio and the diagonal edge ratio, each non-Manhattan, non-45-degree, or non-135-degree edge is decomposed into Manhattan and diagonal segments. As shown in FIG. 5B, the edge 502 (FIG. 5A) is decomposed into a horizontal (Manhattan) segment 512 and a shorter diagonal segment 514. The converted tree 516 can be used when determining the number of conductor layers to assign to diagonal and Manhattan routings. For example, the converted tree 516 may be used in the processes shown in FIGS. 3, 4, 7, 9, and 10. The types of edges and the lengths of the edges or the number of the edges are considered when estimating a demand for resources (e.g., a demand for routing and layers) and an estimate for the numbers of diagonal and Manhattan layers.

Figure 6:
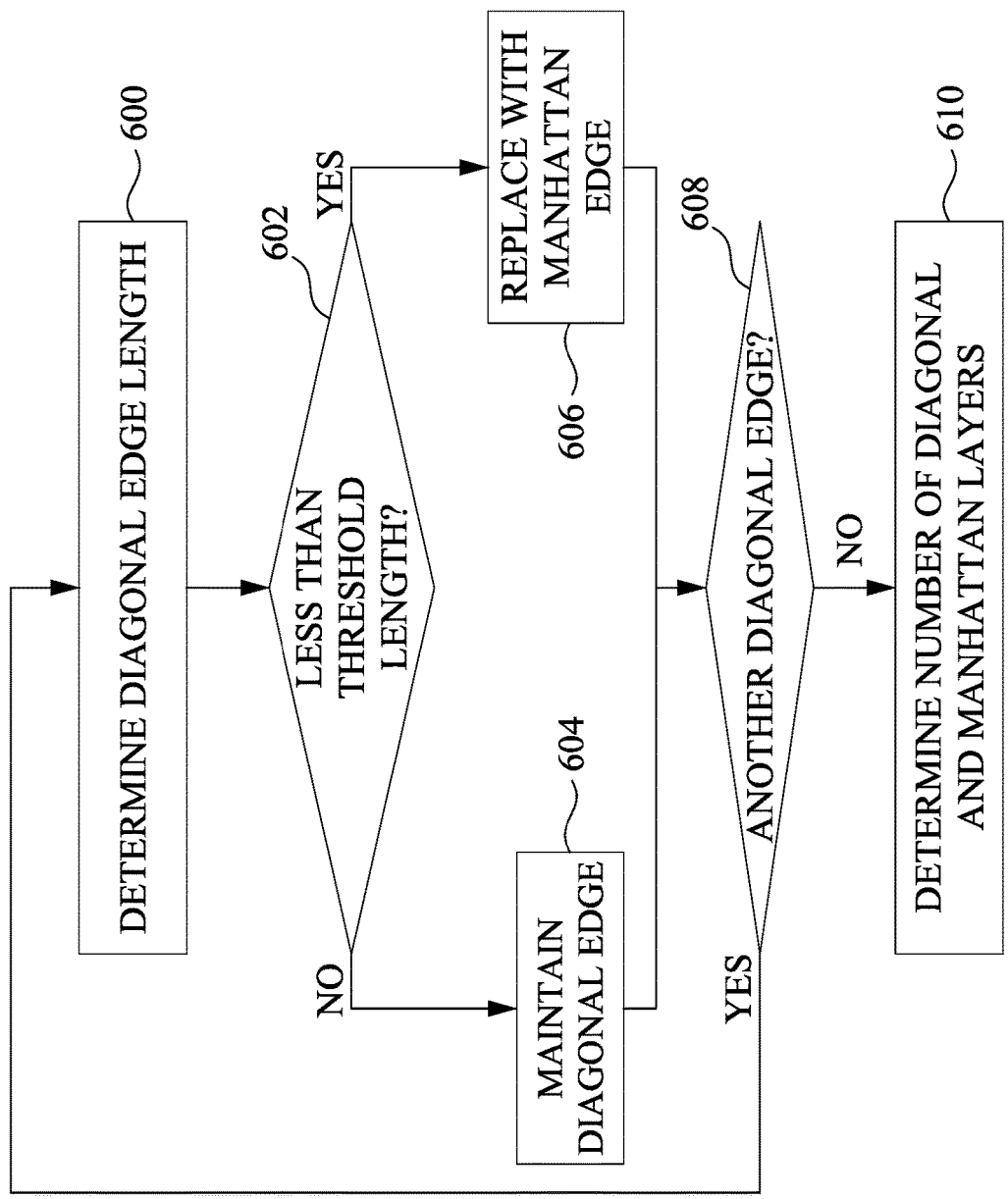
FIG. 6 depicts a flowchart of a first example method of handling shorter diagonal edges in accordance with some embodiments.
Figure 8:
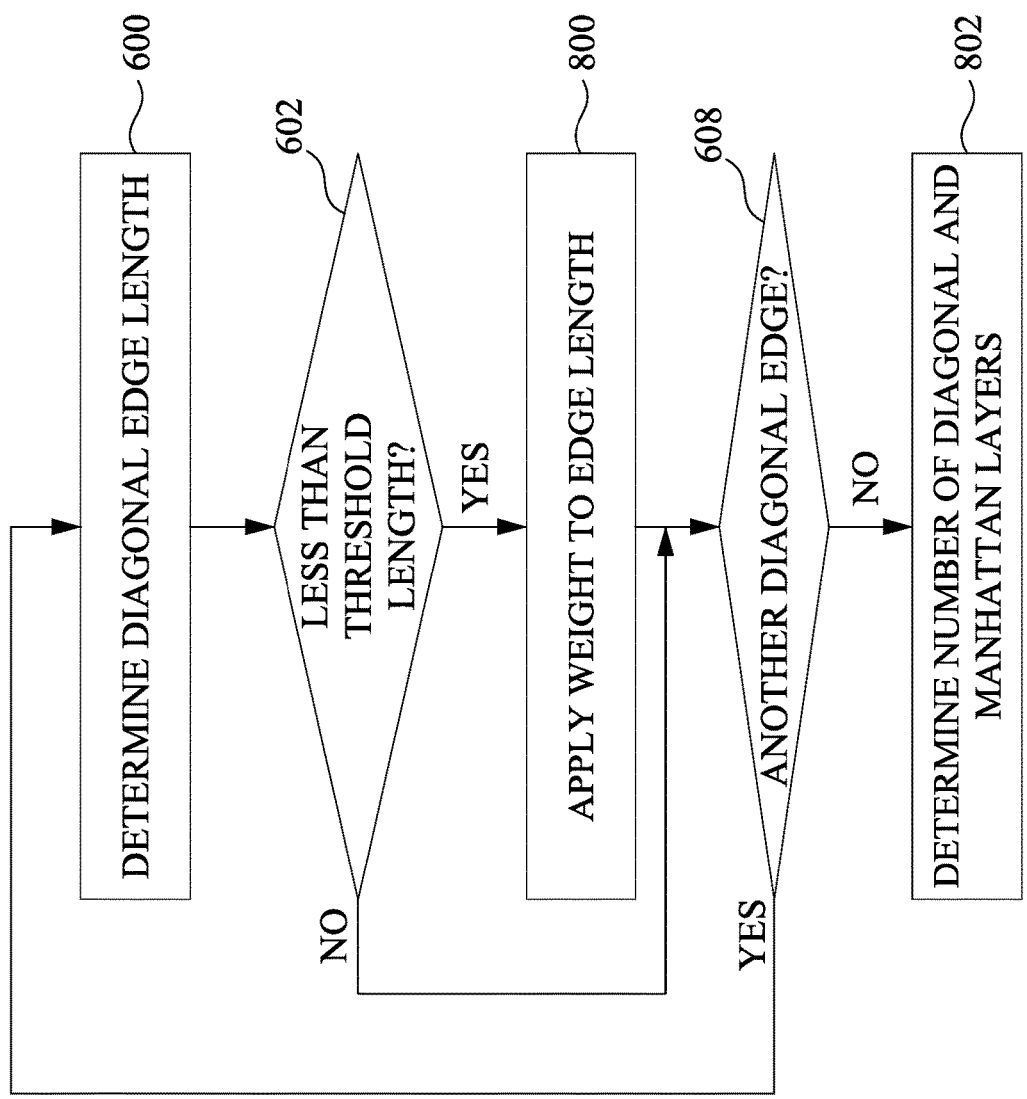
FIG. 8 depicts a flowchart of a second example method of handling shorter diagonal edges in accordance with some embodiments.

In some instances, shorter diagonal edges raise issues in a design, particularly when the diagonal layers are at the higher conductor layers. To contact the pins of the shorter diagonal layers, the vias to the diagonal layers are typically stacked. Issues can arise with stacked vias, including via misalignment and violations of design rules regarding a minimum area and a maximum number of stacked vias. FIGS. 6 and 8 illustrate example methods of processing the shorter diagonal edges to reduce the impact of the shorter diagonal edges in an integrated circuit design.

FIG. 6 depicts a flowchart of a first example method of handling shorter diagonal edges in accordance with some embodiments. Initially, the length of a diagonal edge is calculated at block 600. A determination is made at block 602 as to whether the determined length is less than a threshold length. If the determined length is greater than the threshold length, the method passes to block 604 where the diagonal edge is maintained in the design (e.g., in a tree). When the determined length is less than the threshold length, the process continues at block 606 where a Manhattan edge (e.g., horizontal or vertical edge) is used in the design instead of the diagonal edge.

A determination is made at block 608 as to whether there is another diagonal edge to be processed. If so, the process returns to block 600 and blocks 600, 602, 604 or 606, and 608 repeat until all of the diagonal edges have been processed. When a determination is made at block 608 that all of the diagonal edges have been handled, the method passes to block 610 where the numbers of diagonal and Manhattan layers are determined. For example, the processes shown in FIG. 3 or 4 can be performed to identify the n conductor layers as either a diagonal layer or a Manhattan layer.

Figure 7:
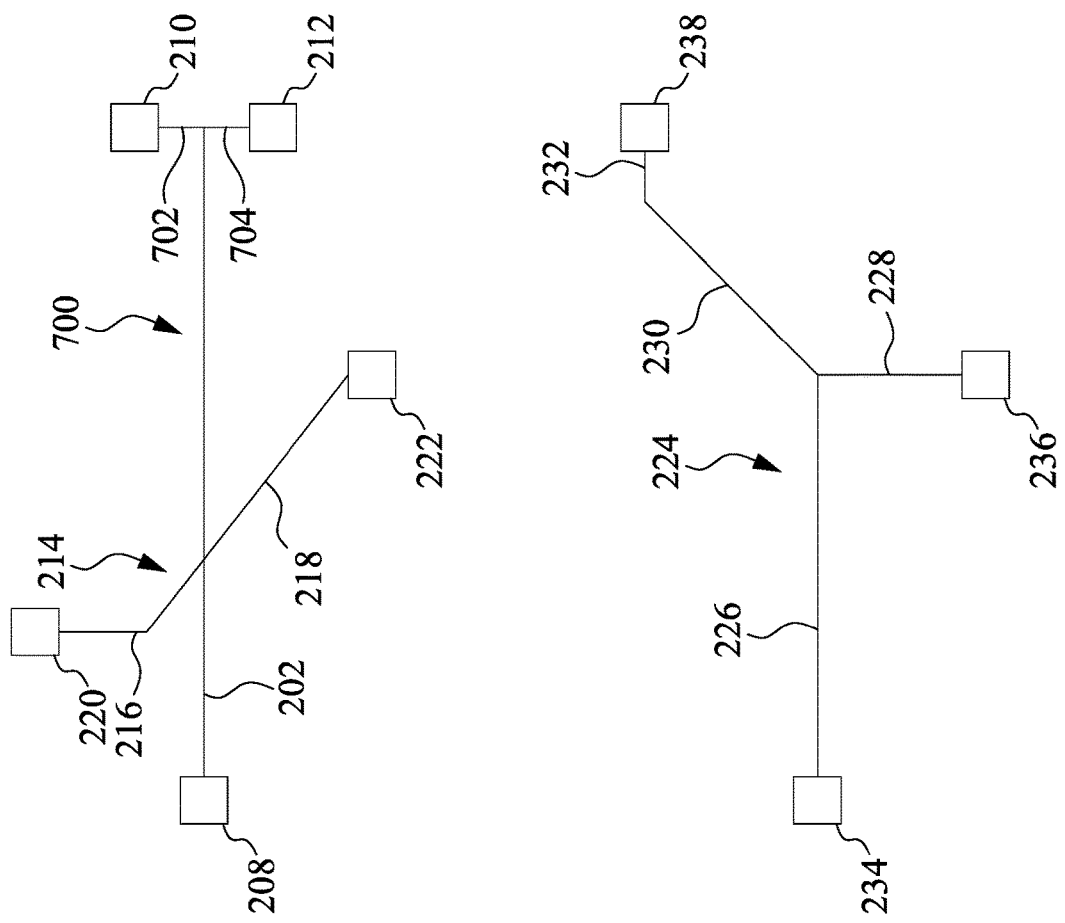
FIG. 7 illustrates example octilinear Steiner trees for three nets in an integrated circuit in accordance with some embodiments.

FIG. 7 illustrates example octilinear Steiner trees for three nets in an integrated circuit in accordance with some embodiments. The octilinear Steiner trees 214, 224 are the same as the octilinear Steiner trees 214, 224 shown in FIG. 2. The octilinear Steiner tree 700 is a modified version of the octilinear Steiner tree 200 depicted in FIG. 2. Essentially, the octilinear Steiner trees 214, 224, 700 are the octilinear Steiner trees 200, 214, 224 in FIG. 2 after the process of FIG. 6 is performed on the diagonal edges 204, 206, 218, 230 (see FIG. 2). The diagonal edges 218, 230 are maintained but the diagonal edges 204, 206 (FIG. 2) are replaced with Manhattan edges 702, 704. In particular, vertical Manhattan edges 702, 704 are used instead of the diagonal edges 204, 206.

The use of the vertical Manhattan edges 702, 704 reduces the total diagonal edge length (block 300 in FIG. 3) while increasing the total Manhattan edge length (block 306). The decreased total diagonal edge length causes the diagonal edge length ratio (block 304) to be smaller. The increased total Manhattan edge length results in a larger Manhattan edge length ratio (bock 308). The decreased diagonal edge length ratio and the increased Manhattan edge length ratio can cause fewer conductor layers in an integrated circuit design to be assigned as diagonal layers and a greater number of conductor layers to be identified as Manhattan layers.

Similarly, the vertical Manhattan edges 702, 704 reduce the total number of diagonal edges (block 400 in FIG. 4) and increase the total number of Manhattan edges (block 406). The decreased diagonal edge ratio and the increased Manhattan edge ratio can cause fewer conductor layers in an integrated circuit design to be assigned as diagonal layers and a greater number of conductor layers to be identified as Manhattan layers to be identified as Manhattan layers.

FIG. 8 depicts a flowchart of a second example method of handling shorter diagonal edges in accordance with some embodiments. FIG. 8 is similar to FIG. 6 except for blocks 800 and 802. As such, blocks 600, 602, 608 are not described in detail again for brevity. When a determination is made at block 602 that the determined length of a diagonal edge is less than the threshold length, a weight or a scale is applied to the determined length. For example, the weight can be a number less than one (1) that when applied to the determined length, reduces or scales the length. Non-limiting examples of a weight include, but are not limited to, 0.5 or 0.2.

When a determination is made at block 608 that another diagonal edge will not be processed (e.g., all of the diagonal edges have been processed), the method passes to block 802 where the number of Manhattan and diagonal layers are determined. In one embodiment, Equation 5 is used to determine the diagonal edge length ratio while Equation 6 is used to calculate the Manhattan edge length ratio.

$$\text{Diagonal Edge Length Ratio } (d\ \%) = \frac{\text{Total Weighted Diagonal Edge Length}}{\text{Total Manhattan Edge Length} + \text{Total Weighted Diagonal Edge Length}} \quad \text{Equation 5}$$

$$\text{Manhattan Edge Length Ratio } (m\ \%) = \frac{\text{Total Manhattan Edge Length}}{\text{Total Manhattan Edge Length} + \text{Total Weighted Diagonal Edge Length}} \quad \text{Equation 6}$$

As described earlier, the number of diagonal layers and the number of Manhattan layers are determined based on the diagonal edge length ratio and the Manhattan edge length ratio. Assuming an integrated circuit will include n conductor layers, where n is a number greater than one, the number of the n conductor layers assigned to Manhattan routing (e.g., the Manhattan layer number or MLN) is MLN=n×m %. The MLN includes a number of conductor layers assigned to vertical routings and a number of conductor layers assigned to horizontal routings.

The number of the n conductor layers that is assigned to diagonal routing (e.g., the diagonal layer number or DLN) is DLN=n×d %. In one embodiment, the DLN includes the number of conductor layers assigned to forty-five (45) degree routing and the number of conductor layers assigned to one hundred and thirty-five (135) degree routings. In one embodiment, the MLN and/or the DLN is divided by two to provide a number of conductor layers assigned to each type of routing (horizontal, vertical, forty-five (45) degree, 135 degree).

Figure 9:
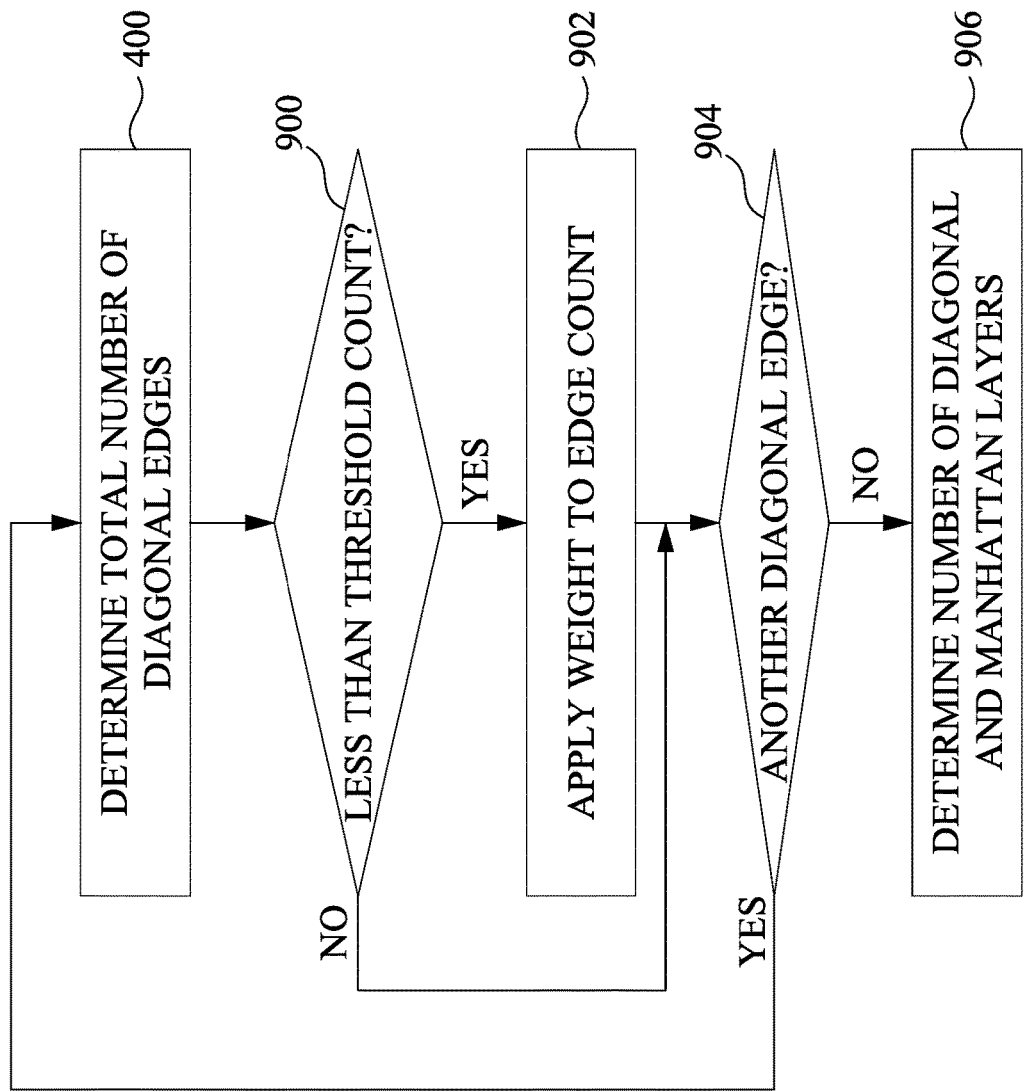
FIG. 9 illustrates a flowchart of a third example method of handling shorter diagonal edges in accordance with some embodiments.

FIG. 9 illustrates a flowchart of a third example method of handling shorter diagonal edges in accordance with some embodiments. Initially, a count (e.g., a total number) of diagonal edges is determined at block 400. For example, in FIG. 2, the total number of diagonal edges 204, 206, 218, 230 is four (4). A determination is then made at block 900 as to whether the determined edge count is less than a threshold count. If so, the process continues at block 902 where a weight is applied to the determined edge count. In one embodiment, the weight is a number less than one (1) that when applied to the determined count, reduces or scales the count. Non-limiting examples of a weight include, but are not limited to, 0.5 or 0.2.

After block 902, or when a determination is made at block 900 that the edge count is greater than the threshold count, the method passes to block 904 where a determination is made as to whether another diagonal edge is to be processed. If so, the process returns to block 400 and blocks 400, 900, and 902 and/or 904 repeat until all of the diagonal edges have been processed.

When a determination is made at block 904 that another diagonal edge will not be processed (e.g., all of the diagonal edges have been processed), the method continues at block 906 where the number of Manhattan and diagonal layers are determined. In one embodiment, Equation 7 is used to determine the diagonal edge ratio while Equation 8 is used to calculate the Manhattan edge ratio.

$$\text{Diagonal Edge Ratio } (d\ \%) = \frac{\text{Total Weighted Diagonal Edges}}{\text{Total Manhattan Edges} + \text{Total Weighted Diagonal Edges}} \quad \text{Equation 7}$$

$$\text{Manhattan Edge Ratio } (m\ \%) = \frac{\text{Total Manhattan Edges}}{\text{Total Manhattan Edges} + \text{Total Weighted Diagonal Edges}} \quad \text{Equation 8}$$

The number of diagonal layers and the number of Manhattan layers are determined based on the diagonal edge ratio and the Manhattan edge ratio. Assuming an integrated circuit will include n conductor layers, where n is a number greater than one, the number of the n conductor layers assigned to Manhattan routing (e.g., the Manhattan layer number or MLN) is MLN=n×m %. The MLN includes a number of conductor layers assigned to vertical routings and a number of conductor layers assigned to horizontal routings.

The number of the n conductor layers that is assigned to diagonal routing (e.g., the diagonal layer number or DLN) is DLN=n×d %. The DLN includes the number of conductor layers assigned to forty-five (45) degree routing and the number of conductor layers assigned to one hundred and thirty-five (135) degree routings. In one embodiment, the MLN and/or the DLN is divided by two to provide a number of conductor layers assigned to each type of routing (horizontal, vertical, forty-five (45) degree, 135 degree).

Figure 10:
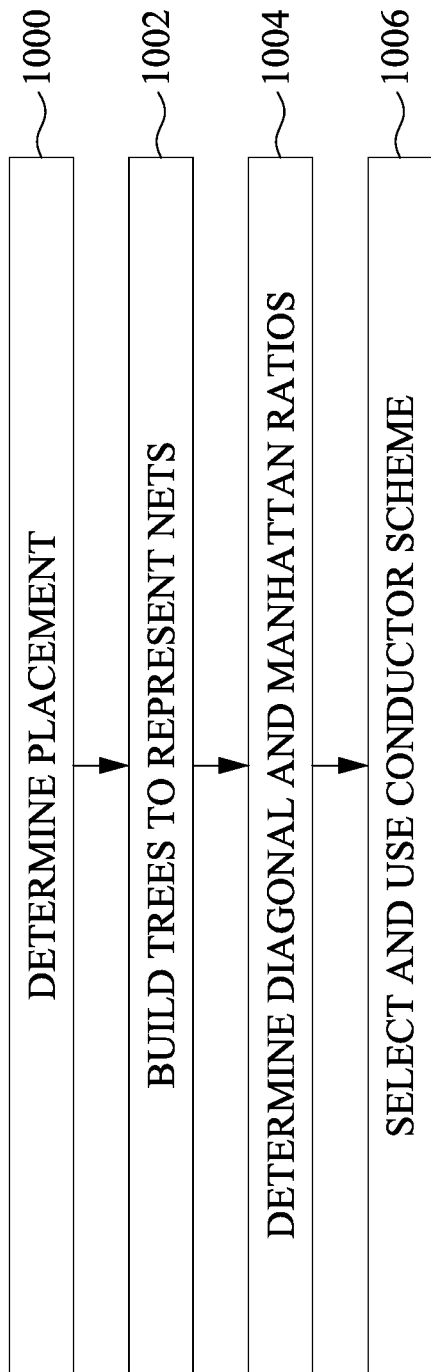
FIG. 10 depicts an example first method of selecting a conductor scheme for an integrated circuit in accordance with some embodiments.

FIG. 10 depicts an example first method of selecting a conductor scheme for an integrated circuit in accordance with some embodiments. In a non-limiting example, the process of FIG. 10 is used to select a metal scheme for an integrated circuit. Initially, placement for the integrated circuit is determined at block 1000. Placement determines the location of each component (e.g., active elements) in the integrated circuit. The trees or representations of the nets are then constructed at block 1002. As noted earlier, a net represents the connection between an input (or inputs) and an output (or outputs) in a circuit or between components of a circuit in the integrated circuit.

Next, as shown in block 1004, the diagonal and the Manhattan ratios are calculated based on the trees generated at block 1002. The diagonal and the Manhattan ratios can be the diagonal and the Manhattan edge length ratios (e.g., FIG. 3, 6, or 8) or the diagonal and the Manhattan edge ratios (e.g., FIG. 4 or 9). In some embodiments, multiple diagonal and Manhattan ratios are determined (e.g. diagonal and Manhattan edge length ratios as well as diagonal and Manhattan edge ratios), and the best or optimum ratios are used. Based on the diagonal and the Manhattan ratios, a conductor scheme for the integrated circuit is selected and used during fabrication of the integrated circuit (block 1006).

Figure 11:
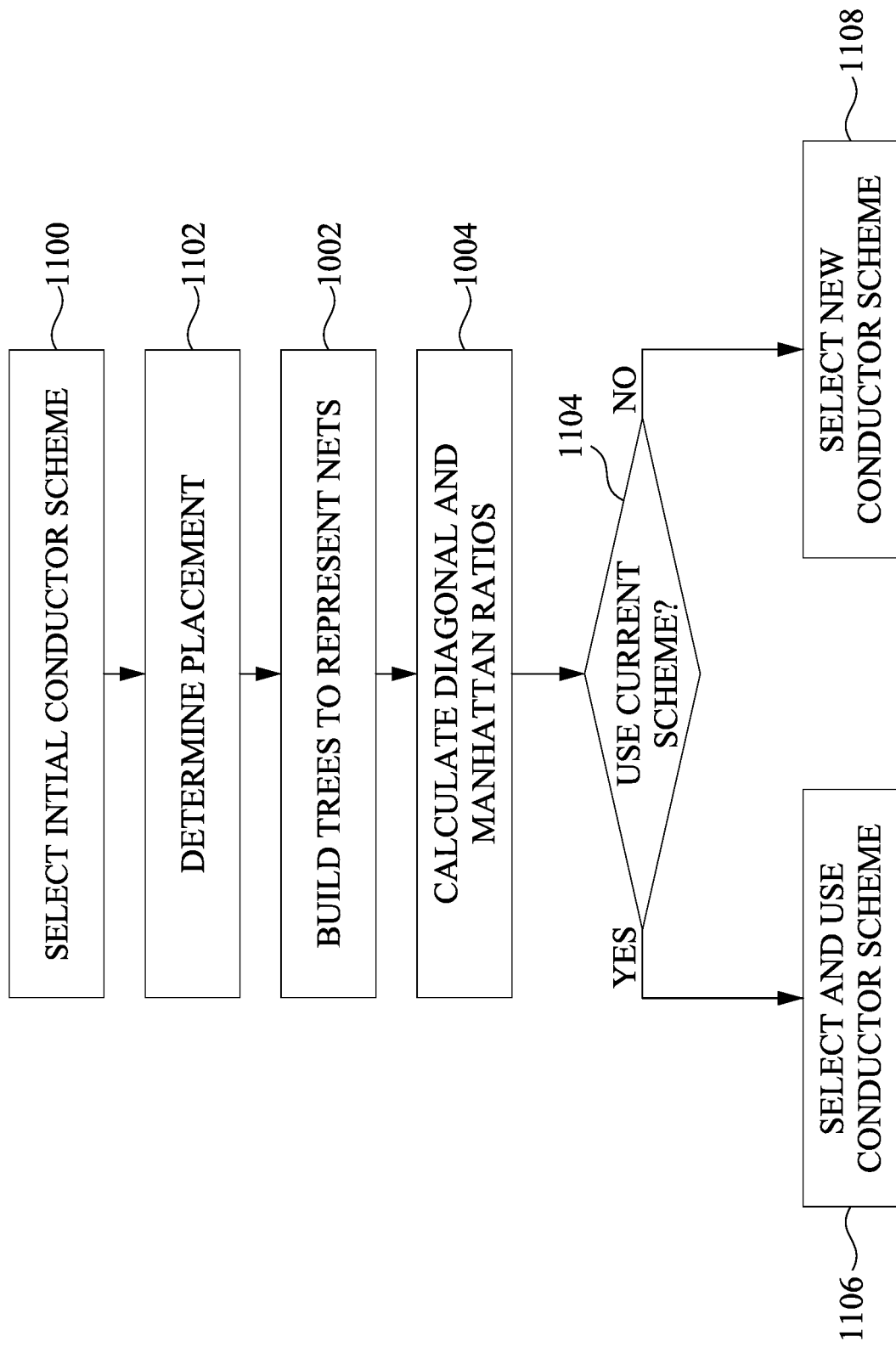
FIG. 11 illustrates an example second method of selecting a conductor scheme for an integrated circuit in accordance with some embodiments.

FIG. 11 illustrates an example second method of selecting a conductor scheme for an integrated circuit in accordance with some embodiments. Initially, an initial conductor scheme is selected at block 1100. The initial conductor scheme may be selected based on the type of integrated circuit being designed and/or on a previously used conductor scheme that was selected for a design that had similar components, trees, and/or numbers of diagonal and Manhattan layers. Placement for the integrated circuit is then determined using the initial conductor scheme (block 1102).

The trees for the nets are created, and based on the trees, the diagonal and the Manhattan ratios are determined (blocks 1002, 1004). A determination is then made at block 1104 as to whether the current conductor scheme is to be used for the integrated circuit. For example, when the method is first performed, the current conductor scheme is the initial conductor scheme. In one embodiment, the initial conductor scheme and additional conductor schemes are compared against the diagonal and the Manhattan ratios to determine if the initial conductor scheme is the best or optimum conductor scheme. The initial and the additional conductor schemes can be stored in a storage device and accessed for the comparison operation. For example, the initial and the additional conductor schemes can be templates or previously designed and/or used conductor schemes that are stored in a database in the storage device.

If a determination is made at block 1104 that the current conductor scheme is to be used, the process passes to block 1106 where the current conductor scheme is selected and used during fabrication of the integrated circuit. When a determination is made at block 1104 that the current scheme will not be used, the method continues at block 1108 where a new conductor scheme is selected and the process returns to block 1102. Blocks 1102, 1002, 1004, 1104 repeat until a determination is made at block 1104 that the current conductor scheme is to be used.

Once the conductor scheme is selected for an integrated circuit, and prior to fabrication of the integrated circuit, the resources for the integrated circuit are planned and the diagonal and Manhattan routings are determined. In some embodiments, a software tool, such as an electronic design application (EDA), is used to generate a global routing for the integrated circuit. The global routing can be determined for the entire integrated circuit (e.g., 2D global routing) or on a layer-by-layer process for all of the conductor layers in the integrated circuit (e.g., 3D global routing). The EDA adds the conductors (e.g., metal lines and/or metal pillars) needed to properly connect the placed components while obeying the design rules for the integrated circuit.

As discussed earlier, Manhattan routing placed the conductors along vertical and horizontal tracks. For global routing, the Manhattan routing for the integrated circuit (or for each conductor layer) is typically divided into bins, also known as G-Cells. Embodiments disclosed herein provide techniques for dividing a mixed-diagonal-Manhattan routing into bins.

Figure 12:
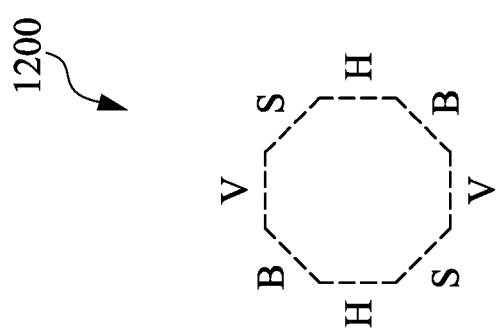
FIG. 12 depicts an octagon-shaped bin for use with mixed-diagonal-Manhattan routing in accordance with some embodiments in accordance with some embodiments.

FIG. 12 depicts an octagon-shaped bin for use with mixed-diagonal-Manhattan routing in accordance with some embodiments. The sides of the octagon-shaped bin 1200 are used to determine the supply and/or the demand for the Manhattan edges (vertical and horizontal edges) and of the diagonal edges. The supply provides a maximum limit of the number of edges that can pass through (e.g., intersect) a side. The demand is a count of the number of edges that will intersect the side. In FIG. 12, the sides labeled "V" are used to determine the supply and/or the demand of the vertical edges, and the sides labeled "H" are used for the horizontal edges. The sides labeled "S" are used to determine the supply and/or the demand of the diagonal edges that are oriented at forty-five (45) degrees, and the sides labeled "B" are used for the diagonal edges oriented at one hundred and thirty-five (135) degrees.

Figure 13:
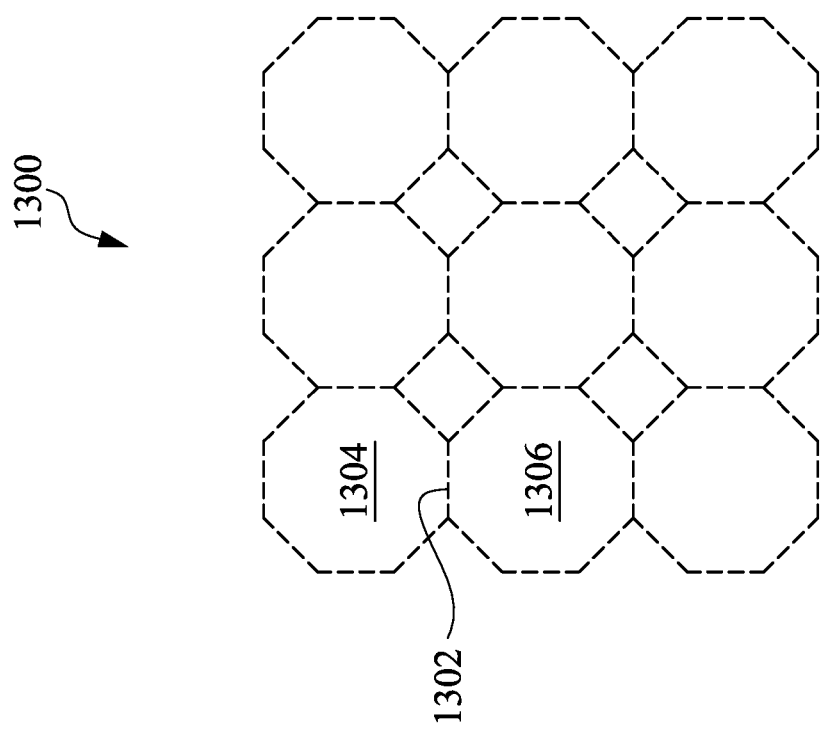
FIG. 13 illustrates a layout of the octagon-shaped bins in accordance with some embodiments in accordance with some embodiments.

FIG. 13 illustrates a layout of the octagon-shaped bins in accordance with some embodiments. Although nine octagon-shaped bins are shown in FIG. 13, other embodiments can include any number of octagon-shaped bins. In the layout 1300, some of the sides of the octagon-shaped bins are shared between two or more bordering bins. For example, side 1302 is shared by bin 1304 and bin 1306. During global routing, a side of an octagon-shaped bin is annotated with a supply and a demand. As noted earlier, the supply provides a maximum limit of the number of edges that can pass through (e.g., intersect) a side, and the demand is a count of the number of edges that will intersect the side. An example process of global routing and annotation is described in more detail in conjunction with FIG. 16.

Figure 14:
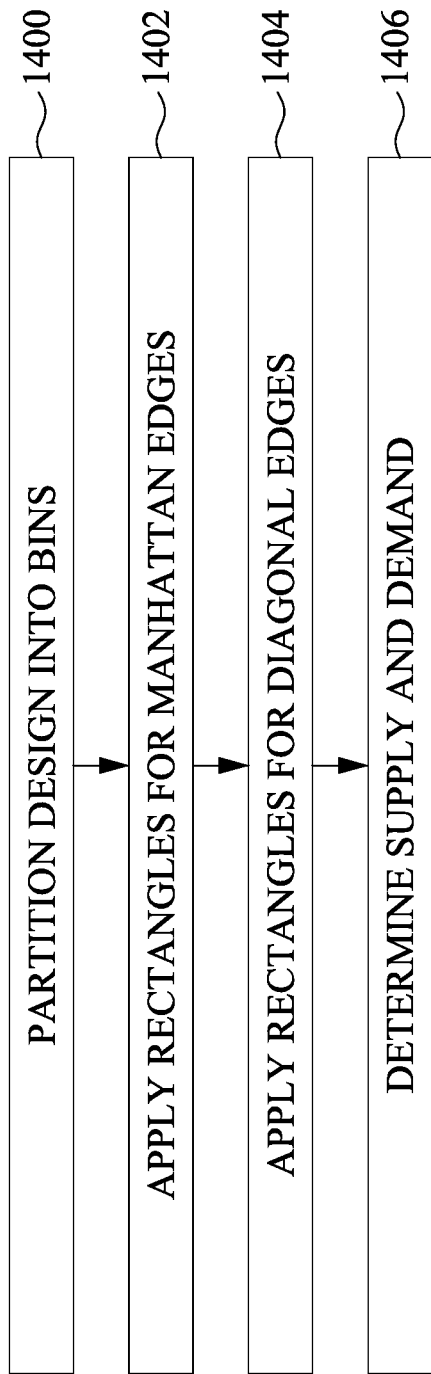
FIG. 14 depicts a flowchart of an example method of global routing with mixed-diagonal-Manhattan routing in accordance with some embodiments.
Figure 15B:
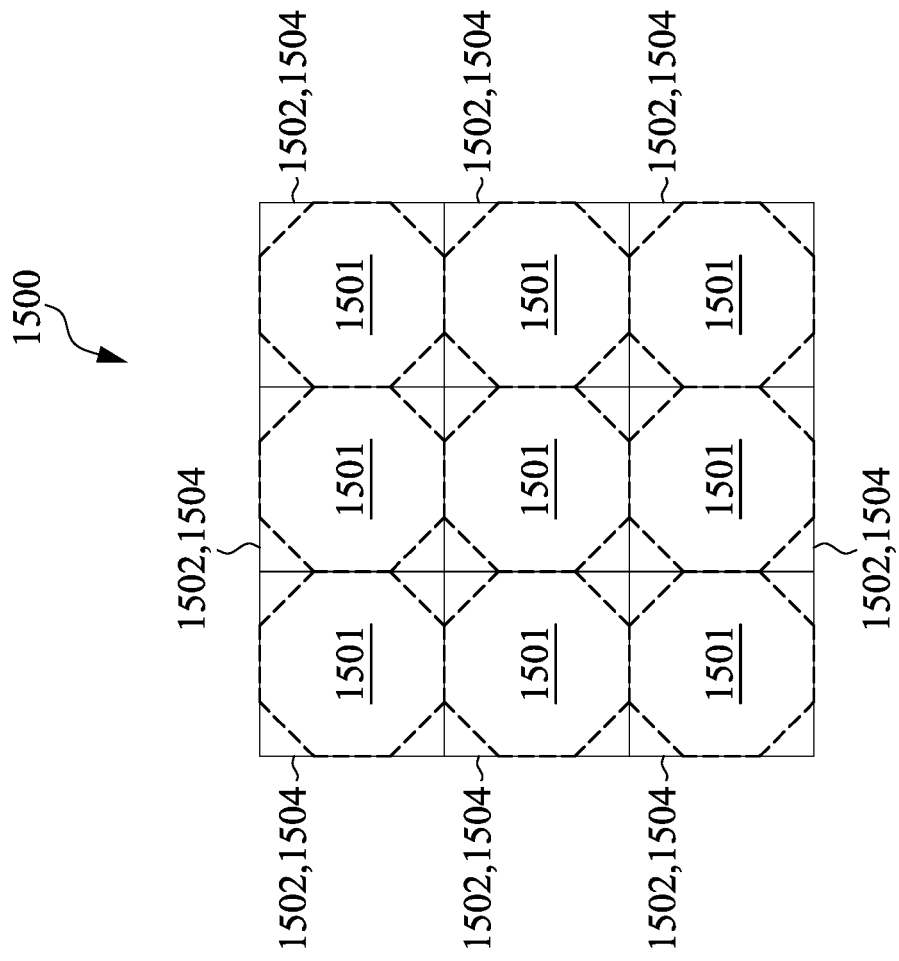
FIGS. 15A-15D illustrate the example method of global routing shown in FIG. 14 in accordance with some embodiments in accordance with some embodiments.
Figure 15A:
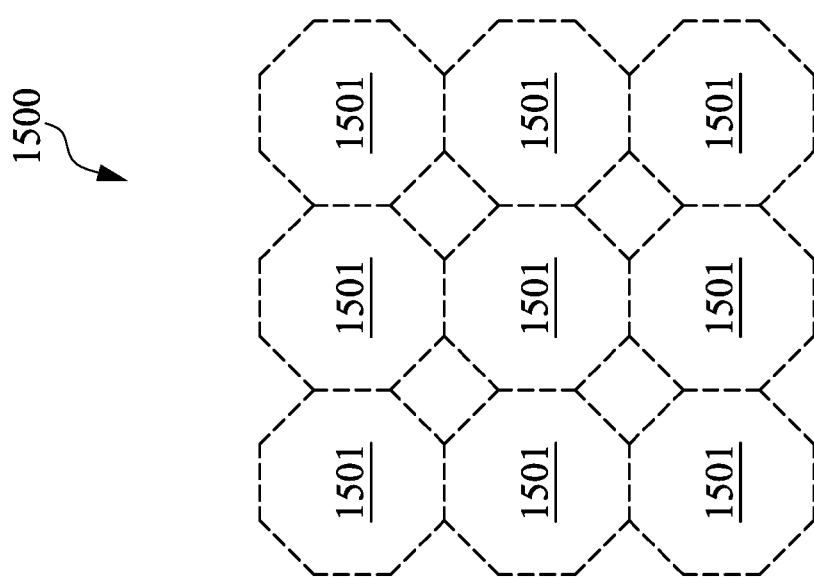

FIG. 14 depicts a flowchart of an example method of global routing with mixed-diagonal-Manhattan routing in accordance with some embodiments. The method is described in conjunction with FIGS. 15A-15D. Initially, the design of the integrated circuit is partitioned into bins at block 1400. In one embodiment, partitioning the design into bins includes determining the dimensions of the octagon-shaped bins and the locations of the octagon-shaped bins to produce a layout for the octagon-shaped bins. FIG. 15A illustrates an example layout 1500 for nine octagon-shaped bins 1501.

Next, as shown in block 1402, rectangles are applied to the layout such that the V and the H sides of the octagon-shaped bins align with the sides of the rectangles. A rectangle is associated with at least one octagon-shaped bin. In one embodiment, the rectangles are applied in two layers (e.g., first rectangles and second rectangles). The first rectangles are used with one set of the Manhattan edges and the second rectangles are used with the other set of the Manhattan edges. For example, the first rectangles can be used to determine the supply and/or the demand for the vertical edges and the second rectangles may be used to ascertain the supply and/or the demand for the horizontal edges. In one embodiment, the first rectangles are overlaid on the layout. FIG. 15B depicts the first rectangles 1502 and the second rectangles 1504 applied to the layout 1500. Since the first and the second rectangles 1502, 1504 have the same shape and the same orientation, the second rectangles 1504 align with the first rectangles 1502.

Rectangles for the diagonal edges are applied to the layout at block 1404. For example, the rectangles may be applied in two layers (e.g., third rectangles and fourth rectangles). The third and the fourth rectangles are used with the diagonal edges. As such, the third and the fourth rectangles are rotated such that the S and the B sides of the octagon-shaped bins align with, or are parallel to, some of the sides of the third and the fourth rectangles. In one embodiment, the third and the fourth rectangles are overlaid on the layout.

Figure 15D:
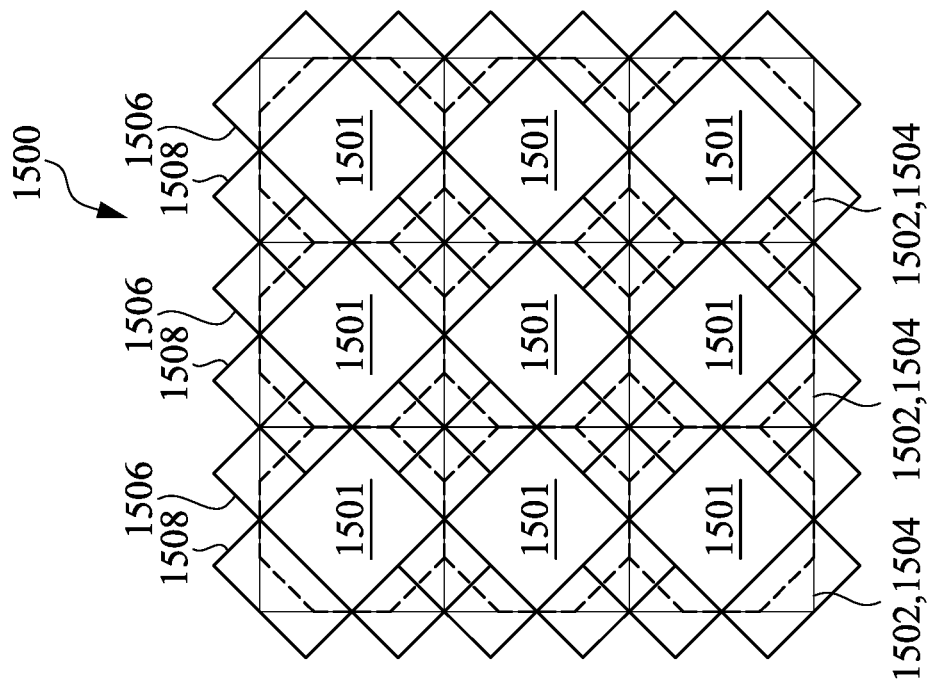
Figure 15C:
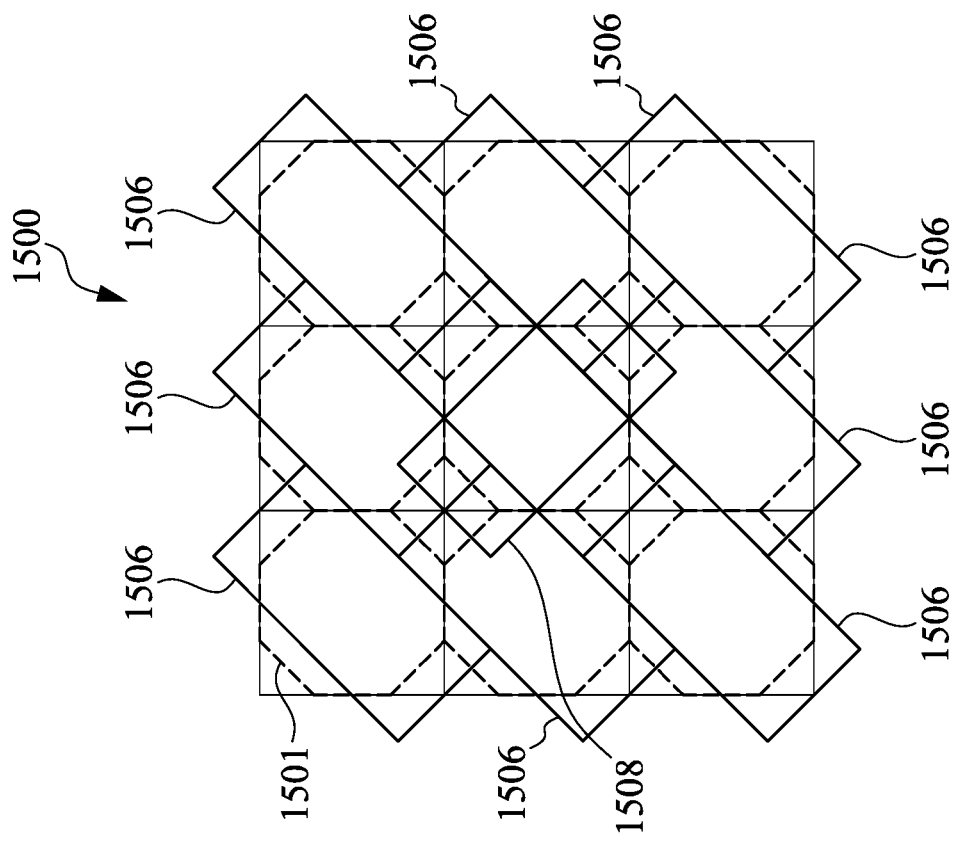

FIG. 15C illustrates the third rectangles 1506 and the fourth rectangles 1508 applied to the layout 1500. The third rectangles 1506 have sides that align with, or are parallel to, the S sides of the octagon-shaped bins 1501. The fourth rectangles 1508 have sides that align with, or are parallel to, the B sides of the octagon-shaped bins 1501. For clarity, only one fourth rectangle 1508 is shown in FIG. 15C.

After the first, the second, the third, and the fourth rectangles are applied to the layout, the supply and/or the demand of the vertical edges, the diagonal edges (e.g., forty-five (45) degrees and 135 degrees), and the horizontal edges are determined at block 1406 using the layout with the first, the second, the third, and the fourth rectangles. FIG. 15D depicts the layout with the applied first, second, third, and fourth rectangles in accordance with some embodiments. For simplicity and clarity, only the first, the second, the third, and the fourth rectangles 1502, 1504, 1506, 1508 along the top and bottom edges are identified in FIG. 15D with the reference numbers 1502, 1504, 1506, 1508. In an example embodiment, the first rectangles 1502 can be used to determine the supply and/or the demand of the vertical edges in the design and the second rectangles 1504 may be used to ascertain the supply and/or the demand of the horizontal edges. The third rectangles 1506 may be used to determine the supply and/or the demand of the diagonal edges that are oriented at forty-five (45) degrees and the fourth rectangles 1508 can be used to determine the supply and/or the demand of the diagonal edges oriented at one hundred and thirty-five (135) degrees in the design. Although FIG. 14 is described in conjunction with specific order for the first, the second, the third, and the fourth rectangles in blocks 1402, 1404, other embodiments can apply the first, the second, the third, and the fourth rectangles for the horizontal, vertical, and diagonal edges in any order.

Figure 16:
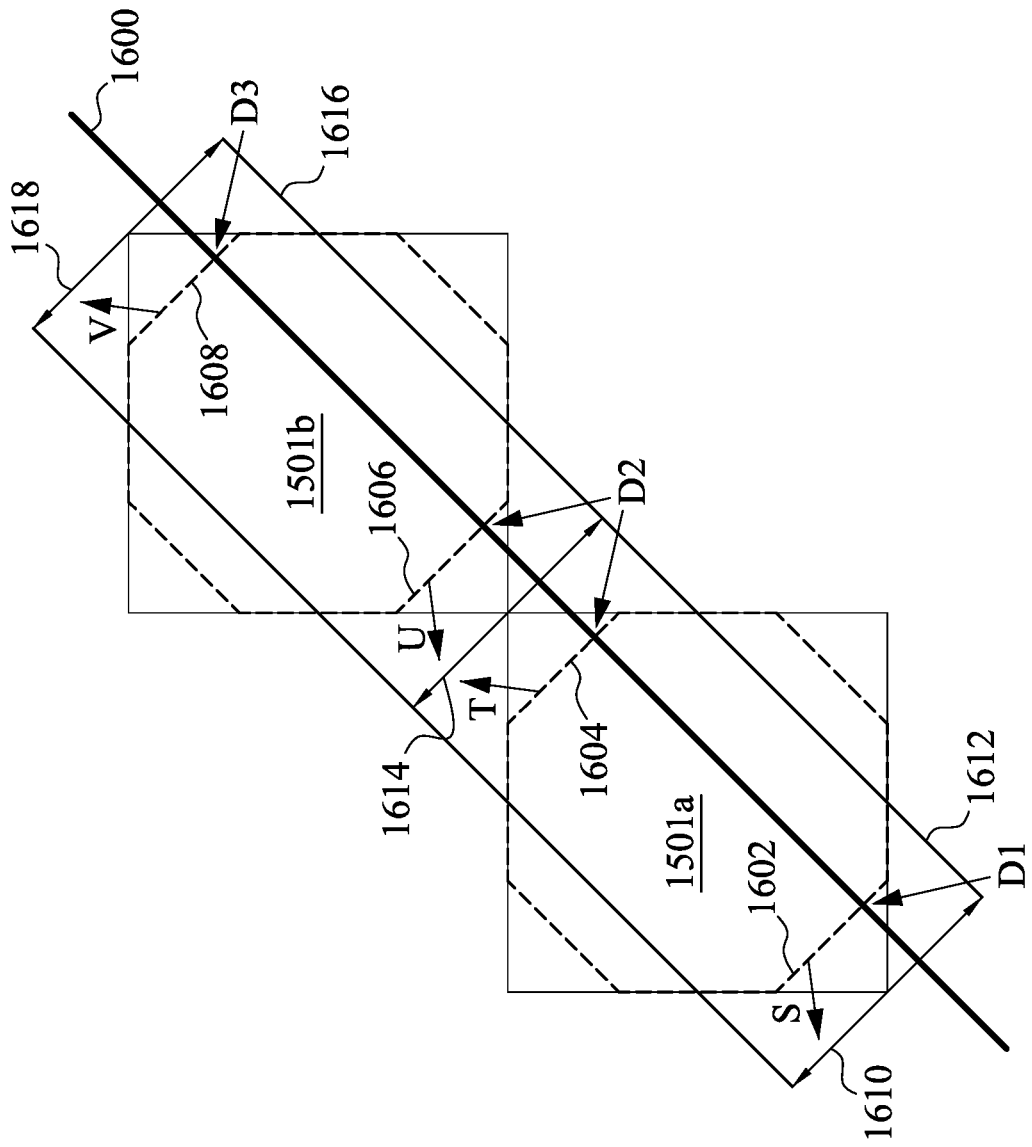
FIG. 16 depict a diagonal track intersecting two octagon-shaped bins with applied first rectangles and second rectangles in accordance with some embodiments.

FIG. 16 illustrates a diagonal track intersecting two octagon-shaped bins with applied first rectangles and second rectangles in accordance with some embodiments. FIG. 16 is used to describe an example determination of the demand of the diagonal edge 1600 for the two octagon-shaped bins 1501a, 1501b. In one embodiment, the supply for the sides of the octagon-shaped bins 1501a, 1501b is determined prior to calculating the demand by, for example, an EDA.

The diagonal edge 1600 crosses the sides 1602, 1604 in the octagon-shaped bin 1501a and the sides 1606, 1608 in the octagon-shaped bin 1501b. The side 1602 is parallel to, and associated with (indicated by arrow S), the side 1610 of the second rectangle 1612. The sides 1604, 1606 are parallel to, and associated with (indicated by arrows T and U), the shared side 1614 of the second rectangles 1612, 1616. The side 1608 is parallel to, and associated with (indicated by arrow V), the side 1618 of the second rectangle 1616. Because the diagonal edge 1600 crosses the sides 1602, 1604, 1606, 1608, the demand (D1) for side 1602 is one (1), the demand (D2) for sides 1604, 1606 is one (1), and the demand (D3) for side 1608 is one (1) in the illustrated embodiment.

In 2D global routing, the conductor layers above a given conductor layer are collapsed into the given conductor layer. Thus, FIG. 15D represents all conductor layers and the supply and/or the demand for all of the conductor layers are determined based on the illustrated octagon-shaped bins 1501 and the first, the second, the third, and the fourth rectangles. In 3D routing, the supply and/or the demand are determined for each conductor layer. FIG. 17 depicts a flowchart of an example method of determining supply and demand in a 3D global routing process in accordance with some embodiments. Initially, the design of a conductor layer is partitioned into bins at block 1700. In one embodiment, partitioning the design into bins includes determining the dimensions of the octagon-shaped bins and the locations of the octagon-shaped bins to produce a layout for the octagon-shaped bins.

Next, as shown in block 1702, first rectangles are applied to the layout. Generally, a first rectangle is associated with one or more of the octagon-shaped bins. In the illustrated embodiment, the first rectangles are used with one set of the Manhattan edges. For example, the first rectangles can be used to determine the supply and/or the demand for the vertical edges in the conductor layer.

Second rectangles for diagonal edges are applied to the layout at block 1704. A second rectangle is associated with one or more of the octagon-shaped bins. The second rectangles are used with one set of diagonal edges. For example, the second rectangles can be used to determine the supply and/or the demand for the diagonal edges in the conductor layer that are oriented at forty-five (45) degrees. At block 1706, third rectangles for diagonal edges are applied to the layout. Generally, a third rectangle is associated with one or more of the octagon-shaped bins. The third rectangles are used with the other set of diagonal edges. For example, the third rectangles can be used to determine the supply and/or the demand for the diagonal edges in the conductor layer that are oriented at one hundred and thirty-five (135) degrees.

Next, as shown in block 1708, fourth rectangles are applied to the layout. A first rectangle is associated with one or more of the octagon-shaped bins. The fourth rectangles are used with the other set of the Manhattan edges. For example, the fourth rectangles can be used to determine the supply and/or the demand for the horizontal edges in the conductor layer.

After the first, the second, the third, and the fourth rectangles are applied to the layout, the supply and/or the demand of the vertical, diagonal (45 degrees and 135 degrees), and horizontal edges are determined at block 1710. A determination is then made at block 1712 as to whether global routing is to be performed for another conductor layer. If so, the process continues at block 1714 where the next conductor layer is selected. The process then returns to block 1700 and blocks 1700, 1702, 1704, 1706, 1708, 1710, 1712, 1714 repeat until a determination is made at block 1712 that all of the conductor layers have been processed and the method ends (block 1716). Although FIG. 17 is described in conjunction with specific edges in blocks 1702, 1704, 1706, 1708, other embodiments can apply the first, the second, the third, and the fourth rectangles for the horizontal, vertical, and diagonal edges in any order.

FIG. 18 illustrates an example first, second, third, and fourth rectangles for an octagon-shaped bin associated with a conductor layer in accordance with some embodiments. The first rectangle 1800 is used for one of the Manhattan edges (e.g., the vertical edges). The second rectangle 1802 is used for one of the diagonal edges (e.g., diagonal edges oriented at 135 degrees). The third rectangle 1804 is used for the other diagonal edges (e.g., diagonal edges oriented at forty-five (45) degrees). The fourth rectangle 1806 is used for the other Manhattan edges (e.g., horizontal edges). As described earlier, the first, the second, the third, and the fourth rectangles 1800, 1802, 1804, 1806 assist in determining the demands for the horizontal, vertical, and diagonal sides of the octagon-shaped bin 1808.

FIG. 19 depicts an example layout of first rectangles that can be used in 3D global routing in accordance with some embodiments. The illustrated layout 1900 includes nine (9) first rectangles 1902, although other embodiments are not limited to this number. After a conductor layer is divided into bins (not shown), a first rectangle 1902 can be associated with each bin in the conductor layer. As described earlier, the first rectangles 1902 are used to determine the supply and/or the demand for one of the Manhattan edges (e.g., the vertical edges).

FIG. 20 illustrates an example layout of second rectangles that can be used in 3D global routing in accordance with some embodiments. The illustrated layout 2000 includes nine (9) second rectangles 2002, although other embodiments are not limited to this number. In one embodiment, a second rectangle 2002 is associated with each bin in the conductor layer. The second rectangles 2002 are used to determine the supply and/or the demand for one of the diagonal edges (e.g., the forty-five (45) degree diagonal edges).

Figure 21:
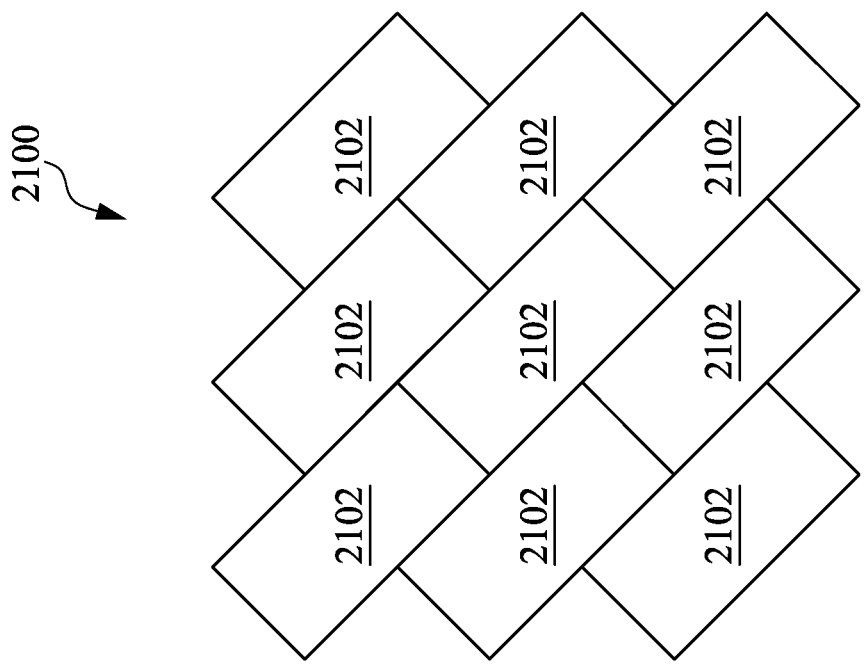
FIG. 21 depicts an example layout of third rectangles that can be used in 3D global routing in accordance with some embodiments.

FIG. 21 depicts an example layout of third rectangles that can be used in 3D global routing in accordance with some embodiments. The illustrated layout 2100 includes nine (9) third rectangles 2102, although other embodiments are not limited to this number. In one embodiment, a third rectangle 2102 is associated with each bin in the conductor layer. The third rectangles 2102 are used to determine the supply and/or the demand for the other diagonal edges (e.g., the 135 degree diagonal edges).

Figure 22:
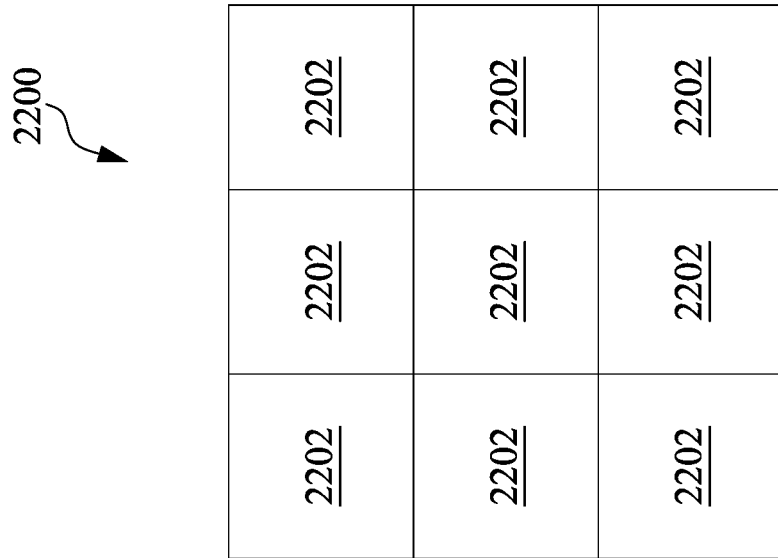
FIG. 22 illustrates an example layout of fourth rectangles that can be used in 3D global routing in accordance with some embodiments.

FIG. 22 illustrates an example layout of fourth rectangles that can be used in 3D global routing in accordance with some embodiments. The illustrated layout 2200 includes nine (9) fourth rectangles 2202, although other embodiments are not limited to this number. In one embodiment, a fourth rectangle 2202 is associated with each bin in the conductor layer. The fourth rectangles 2202 are used to determine the supply and/or the demand for the other Manhattan edges (e.g., the horizontal edges).

Figure 23:
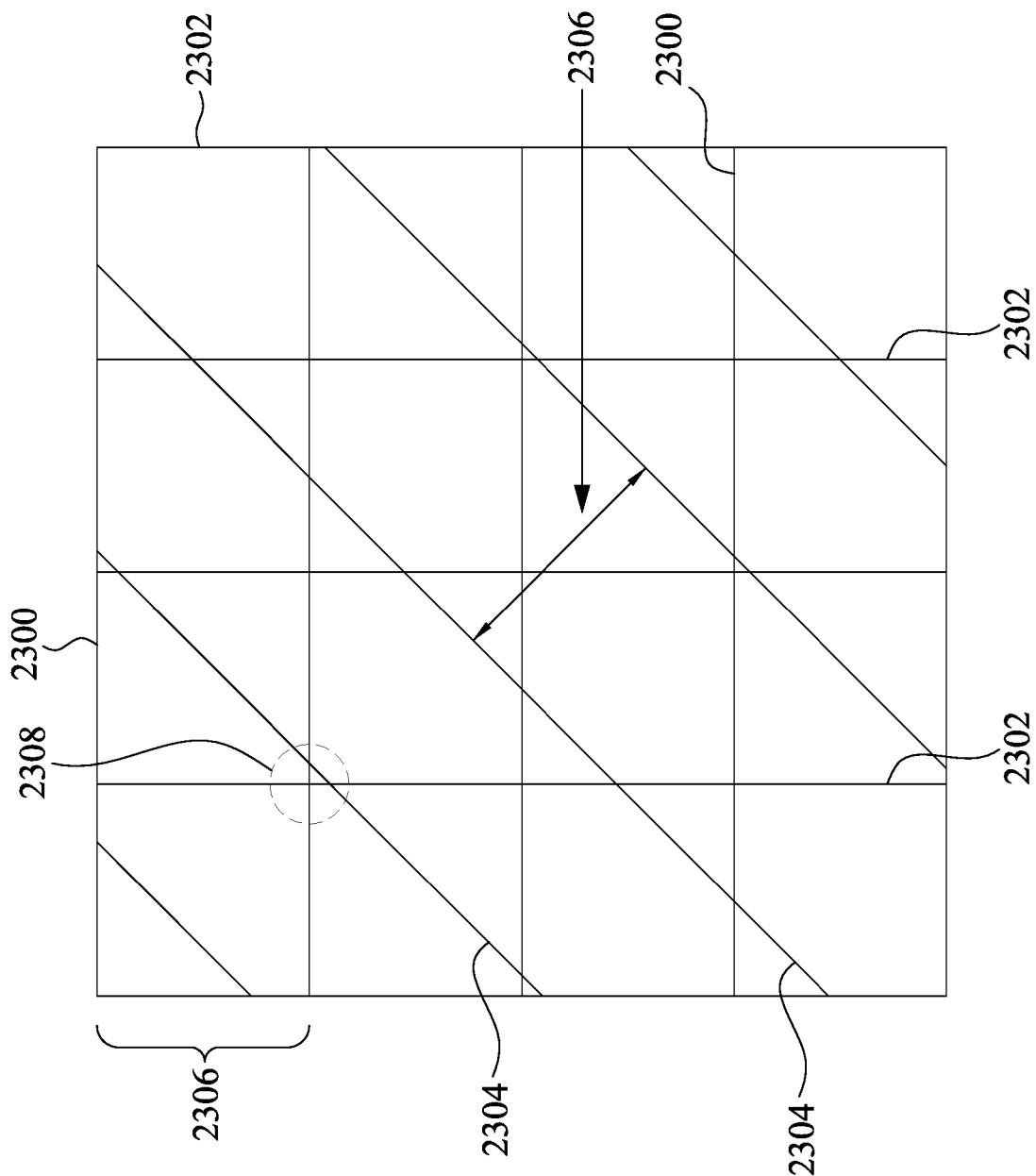
FIG. 23 depicts an example first pitch for Manhattan and diagonal tracks in accordance with some embodiments.

FIG. 23 depicts an example first pitch for Manhattan and diagonal tracks in accordance with some embodiments. The horizontal tracks 2300 represent paths or routes for the conductors in the horizontal direction. The vertical tracks 2302 represent the routes for the conductors in the vertical direction. The diagonal tracks 2304 represent the routes for the conductors in the diagonal direction. Pitch 2306 represents the minimum pitch for the tracks 2300, 2302, 2304. In one embodiment, the minimum pitch is defined by one or more design rules for the integrated circuit, and the minimum pitch is the same for the spacing between the horizontal tracks 2300, the vertical tracks 2302, and the diagonal tracks 2304.

However, as shown in FIG. 23, in some instances the pitch 2306 results in the diagonal tracks 2304 not crossing or intersecting the same point that the horizontal and vertical tracks 2300, 2302 cross (see highlighted area 2308). The diagonal tracks 2304 intersect the vertical tracks 2302 at one point and cross the horizontal tracks 2300 at a different point. Thus, the diagonal tracks 2304 are misaligned with respect to the intersection points. In some implementations, diagonal track misalignment can cause issues with stacked vias.

Figure 24:
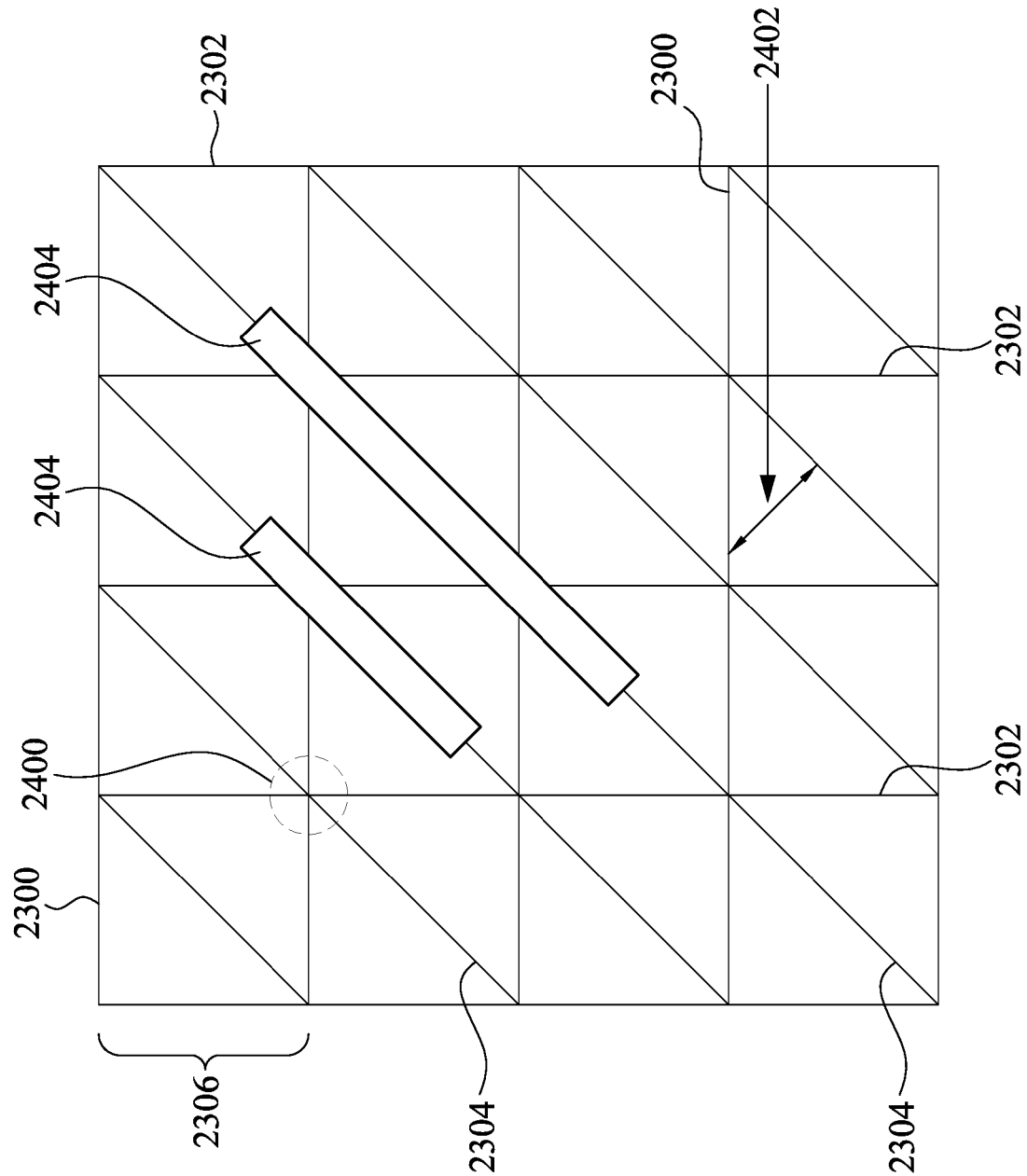
FIG. 24 illustrates an example pitch for the Manhattan tracks and an example pitch for the diagonal tracks in accordance with some embodiments.

FIG. 24 illustrates an example pitch for the Manhattan tracks and an example pitch for the diagonal tracks in accordance with some embodiments. When the horizontal tracks 2300, the vertical tracks 2302, and the diagonal tracks 2304 are aligned to intersect at the same point (see highlighted area 2400), the pitch 2402 between the diagonal tracks 2304 is reduced and does not match the pitch 2306. For example, the pitch 2402 can be defined by (minimum pitch (2306)÷1.414), where 1.414 is the square root of two (2). In some instances, the reduced pitch 2402 can cause the conductors 2404 that are placed along adjacent diagonal tracks 2304 to be too close to each other. The pitch 2402 can violate the minimum pitch design rule for the conductors 2404.

Figure 25:
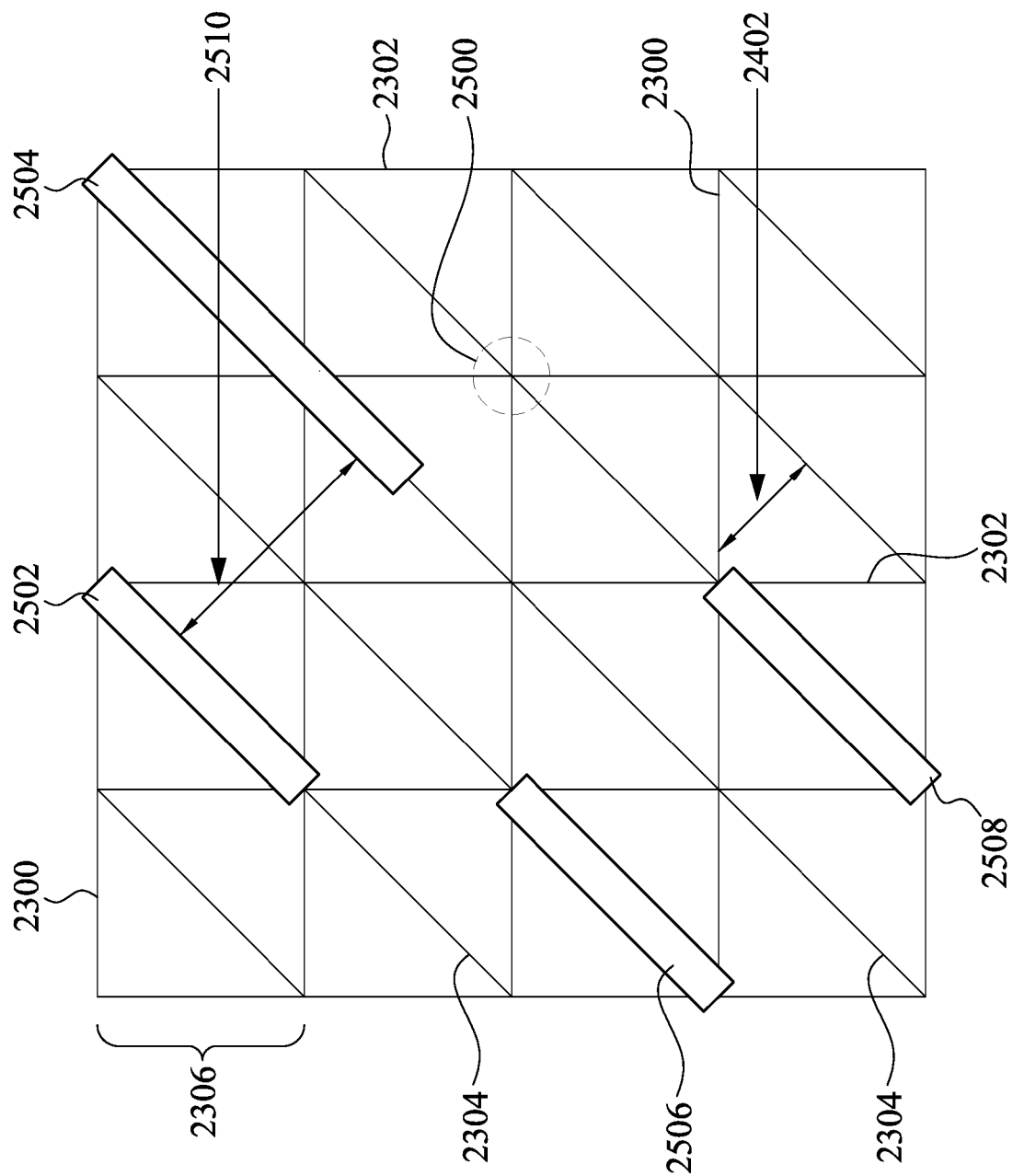
FIG. 25 depicts an example pitch between conductive lines disposed along the diagonal tracks in accordance with some embodiments.

FIG. 25 depicts an example pitch between conductors disposed along the diagonal tracks in accordance with some embodiments. In FIG. 25, the horizontal tracks 2300, the vertical tracks 2302, and the diagonal tracks 2304 are aligned to intersect at the same point (see highlighted area 2500) and the pitch 2402 is less than the pitch 2306. To compensate for the reduced pitch 2402, conductors are positioned at different locations along the diagonal tracks 2304. For example, the conductors 2502, 2504 are disposed on the diagonal tracks 2304 such that one diagonal track is between the conductors 2502, 2504. Similarly, the conductors 2506, 2508 are disposed on the diagonal tracks 2304 such that one diagonal track is between the conductors 2506, 2508. Additionally, the conductors 2506, 2508 are positioned at different locations on the diagonal tracks 2304 compared to the locations of the conductors 2502, 2504. In the illustrated embodiment, the locations of the conductors 2506, 2508 do not overlap with (e.g., are not adjacent to) the locations of the conductors 2502, 2504. Accordingly, the pitch 2510 between the conductors 2502, 2504, 2506, 2508 is greater than the pitch 2306. In a non-limiting example, the pitch 2402 is defined by (minimum pitch (2306)÷1.414) and the pitch 2510 is determined by (minimum pitch (2306)× 1.414).

In some embodiments, a design for an IC is provided by a computer system such as an Electronic Computer-Aided Design (ECAD) system. ECAD tools and methods facilitate the design, partition, and placement of circuits and/or components in an IC on a semiconductor substrate. The ECAD process typically includes turning a behavioral description of an IC into a functional description, which is then decomposed into logic functions and mapped into cells that implement the logic or other electronic functions. Such cells may be defined and stored in a cell library. Once mapped, a synthesis is performed to turn the structural design into a physical layout. In some instances, the design may be optimized post layout.

Figure 26:
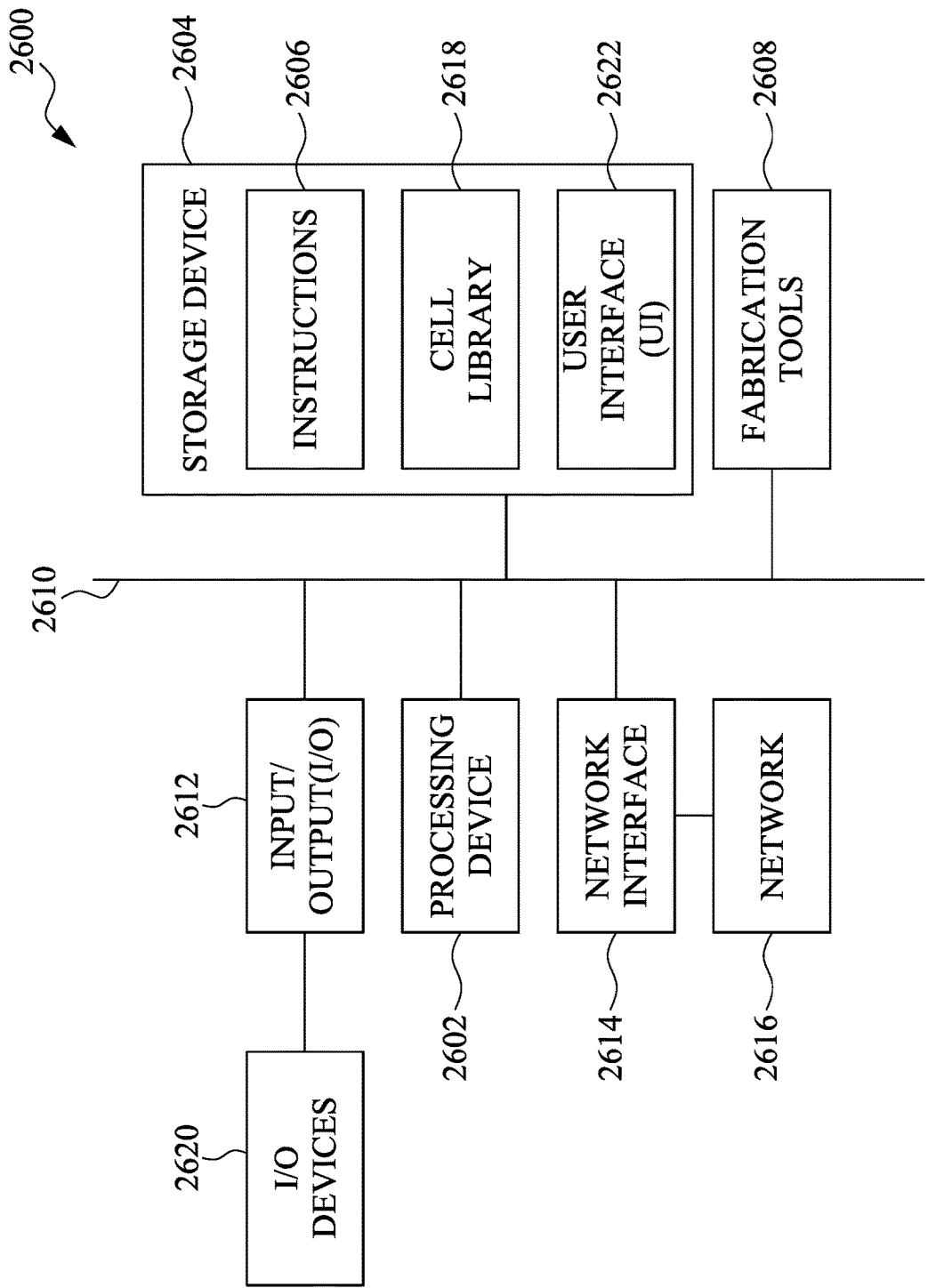
FIG. 26 illustrates an example system that is suitable for designing an integrated circuit in accordance with some embodiments.

FIG. 26 illustrates a block diagram of an example system that is suitable for designing an integrated circuit in accordance with some embodiments. The design process may be implemented by a computer system, such as an ECAD system. Some or all of the operations for design (e.g., layout) methods disclosed herein are capable of being performed as part of a design procedure performed in a design house, such as the design house 2702 discussed below in conjunction with FIG. 27.

In some embodiments, the system 2600 includes an automated place and route (APR) system. In some embodiments, the system 2600 includes a processing device 2602 and a non-transitory, computer-readable storage medium 2604 ("storage device"). The processing device 2602 is any suitable processing device or processing devices. Example processing devices include, but are not limited to, a central processing unit, a microprocessor, a distributed processing system, an application specific integrated circuit, a graphics processing unit, a field programmable gate array, or combinations thereof.

The storage device 2604 may be encoded with or store, for example, computer program code (e.g., a set of executable instructions 2606). Execution of the executable instructions 2606 by the processing device 2602 represents (at least in part) an ECAD tool that implements a portion or all of, the methods described herein to produce the designs for the structures and the ICs disclosed herein. Further, the fabrication tools 2608 may be included for layout and physical implementation of the ICs. In one or more embodiments, the storage device 2604 is an electronic, magnetic, optical, electromagnetic, infrared, and/or a semiconductor system (or apparatus or device). For example, the storage device 2604 includes a semiconductor or solid-state memory, a magnetic tape, a removable computer diskette, a random access memory (RAM), a read-only memory (ROM), a rigid magnetic disk, and/or an optical disk. In one or more embodiments using optical disks, the storage device 2604 includes a compact disk-read only memory (CD-ROM), a compact disk-read/write (CD-R/W), and/or a digital video disc (DVD).

The processing device 2602 is operably connected to the storage device 2604 via a bus 2610. The processing device 2602 is also operably connected to an input/output (I/O) interface 2612 and a network interface 2614 by the bus 2610. The network interface 2614 is operably connected to a network 2616 so that the processing device 2602 and the storage device 2604 are capable of connecting to external elements via the network 2616. In one or more embodiments, the network 2616 is illustrative of any type of wired and/or wireless network, such as an intranet and/or a distributed computing network (e.g., the Internet).

The network interface 2614 allows the system 2600 to communicate with other computing or electronic devices (not shown) via the network 2616. The network interface 2614 includes wireless network interfaces and/or wired network interfaces. Example wireless network interfaces include BLUETOOTH, WIFI, WIMAX, GPRS, or WCDMA. Example wired network interfaces include ETHERNET, USB, or IEEE-1364. In one or more embodiments, some or all of the processes and/or methods disclosed herein are implemented in a distributed system via the network 2616.

The processing device 2602 is configured to execute the executable instructions 2606 encoded in the storage device 2604 to cause the system 2600 to be usable for performing some or all of the processes and/or methods. For example, an electronic design application (e.g., in an ECAD system or as a standalone application) can be configured to perform the methods and techniques shown in FIGS. 2-25. Given the complexity of integrated circuits, and since integrated circuits include thousands, millions, or billions of components, the human mind is unable to perform the methods and techniques depicted in FIGS. 2-25. Unlike the human mind, an electronic design application is able to perform the operations associated with FIGS. 2-25.

In one or more embodiments, the storage device 2604 stores the executable instructions 2606 configured to cause the system 2600 to be usable for performing some or all of the processes and/or methods. In one or more embodiments, the storage device 2604 also stores information that facilitates execution of a portion of or all of the processes and/or methods. In one or more embodiments, the storage device 2604 stores a cell library 2618 that includes (at least in part) standard and/or previously designed cells.

The I/O interface 2612 is operably connected to I/O devices 2620. In one or more embodiments, the I/O devices 2620 include one or more of an image capture device, a microphone, a scanner, a keyboard, a keypad, a mouse, a trackpad, a touchscreen, and/or cursor direction keys for communicating information and commands to the processing device 2602. The I/O devices 2620 may also include one or more displays, one or more speakers, a printer, headphones, a haptic or tactile feedback device, and the like.

The system 2600 is configured to receive information through the I/O interface 2612. The information received through the I/O interface 2612 includes one or more of instructions, data, design rules, cell libraries, and/or other parameters for processing by the processing device 2602. The information is transferred to the processing device 2602 via the bus 2610. The system 2600 is configured to receive information related to a user interface (UI) through the I/O interface 2612. The information is stored in the storage device 2604 as a UI 2622 or for presentation in the UI 2622.

In some embodiments, a portion or all of the processes and/or methods is implemented as a standalone software application (e.g., an EDA) for execution by a processing device (e.g., processing device 2602). In some embodiments, a portion or all of the processes and/or methods is implemented as a software application that is a part of an additional software application. In some embodiments, a portion or all of the processes and/or methods is implemented as a plug-in to a software application. In some embodiments, at least one of the processes and/or methods is implemented as a software application that is a portion of an EDA tool. In some embodiments, a portion or all of the processes and/or methods is implemented as a software application that is used by the system 2600. In some embodiments, a layout diagram which includes standard and/or previously designed cells is generated using a tool such as VIRTUOSO available from CADENCE DESIGN SYSTEMS, Inc., or another suitable layout generating tool.

In some embodiments, the processes are realized as functions of a program stored in a non-transitory computer readable recording medium (e.g., the storage device 2604). Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

As noted above, embodiments of the system 2600 may include the fabrication tools 2608 for implementing the processes and/or methods stored in the storage device 2604. For instance, a synthesis may be performed on a design in which the behavior and/or functions desired from the design are transformed to a functionally equivalent logic gate-level circuit description by matching the design to cells selected from the cell library 2618. The synthesis results in a functionally equivalent logic gate-level circuit description, such as a gate-level netlist. Based on the gate-level netlist, a photolithographic mask may be generated that is used to fabricate the IC by the fabrication tools 2608. Further aspects of device fabrication are disclosed in conjunction with FIG. 27, which is a block diagram of an integrated circuit manufacturing system, and a manufacturing flow associated therewith, in accordance with some embodiments. In some embodiments, based on a layout diagram, at least one of: (a) one or more semiconductor masks; or (b) at least one component in a layer of a semiconductor IC is fabricated using the manufacturing system 2700.

In the illustrated embodiment, the IC manufacturing system 2700 includes entities, such as a design house 2702, a mask house 2704, and an IC manufacturer/fabricator ("fab") 2706, that interact with one another in the design, development, and manufacturing cycles and/or services related to manufacturing an IC 2708, such as the ICs disclosed herein. The entities in the system 2700 are operably connected by a communication network (not shown). In some embodiments, the communication network is a single network. In some embodiments, the communication network is a variety of different networks, such as an intranet and the Internet. The communication network includes wired and/or wireless communication channels.

Each entity interacts with one or more of the other entities and provides services to and/or receives services from one or more of the other entities. In some embodiments, two or more of the design house 2702, the mask house 2704, and the IC fab 2706 is owned by a single company. In some embodiments, two or more of the design house 2702, the mask house 2704, and the IC fab 2706 coexist in a common facility and use common resources.

The design house (or design team) 2702 generates an IC design layout diagram 2710. The IC design layout diagram 2710 includes various geometrical patterns, or IC layout diagrams designed for the IC 2708 to be fabricated. The geometrical patterns correspond to patterns of metal, oxide, or semiconductor layers that make up the various components of the IC 2708 to be fabricated. The various layers combine to form various IC features. For example, a portion of the IC design layout diagram 2710 includes various IC features, such as active regions, gate electrodes, source and drain, metal lines or local vias, and openings for bonding pads, to be formed in a semiconductor substrate (such as a silicon wafer) and various material layers disposed on the semiconductor substrate.

The design house 2702 implements a design procedure to form the IC design layout diagram 2710. The design procedure includes one or more of logic design, physical design or place and route. The IC design layout diagram 2710 is presented in one or more data files having information of the geometrical patterns. For example, the IC design layout diagram 2710 can be expressed in a GDS file format, a GDSII file format, or a DFII file format.

Figure 27:
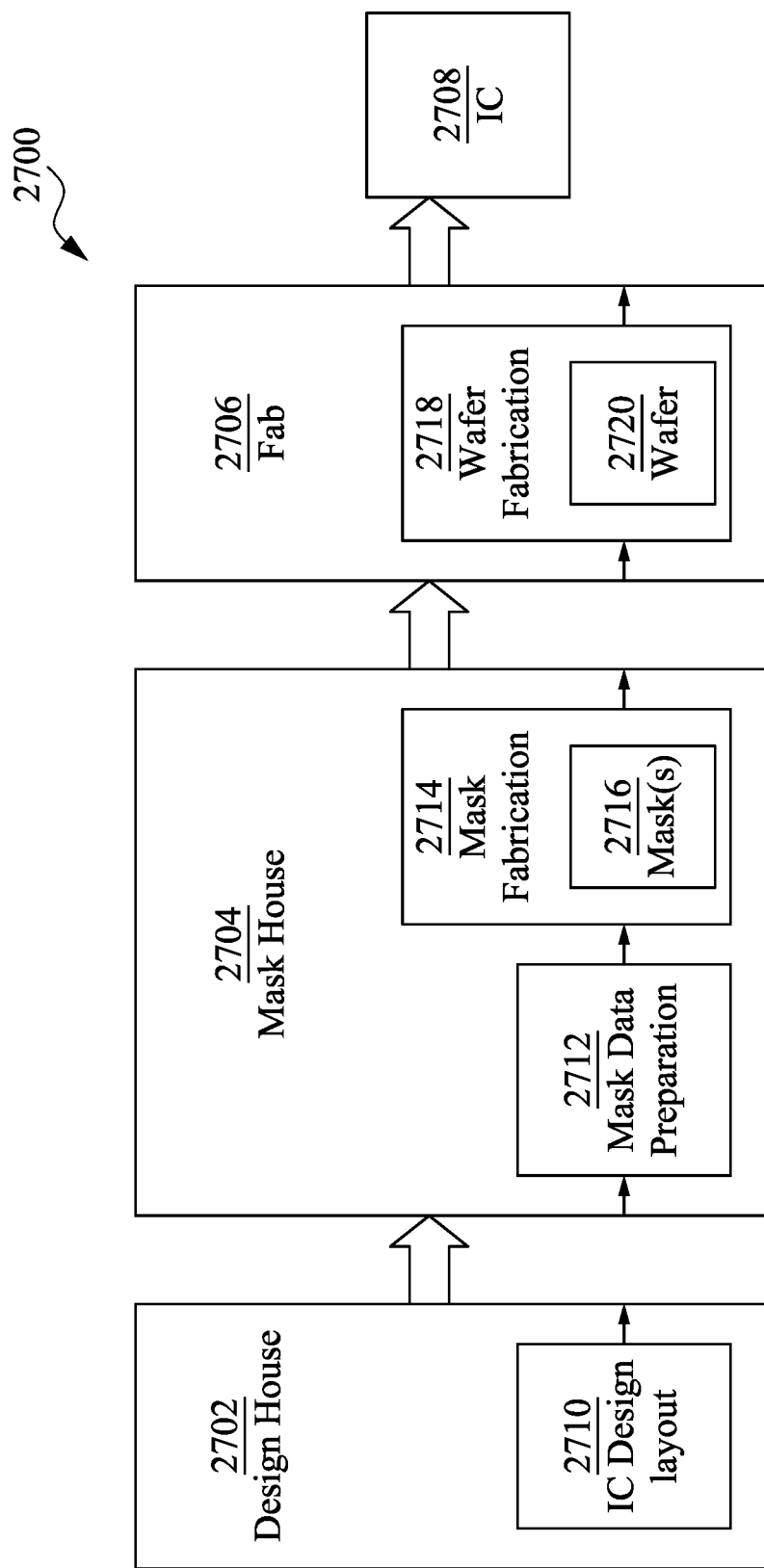
FIG. 27 depicts a block diagram of an example integrated circuit manufacturing system and manufacturing flow in accordance with some embodiments.

The mask house 2704 includes mask data preparation 2712 and mask fabrication 2714. The mask house 2704 uses the IC design layout diagram 2710 to manufacture one or more masks 2716 to be used for fabricating the various layers of the IC 2708 according to the IC design layout diagram 2710. The mask house 2704 performs mask data preparation 2712, where the IC design layout diagram 2710 is translated into a representative data file ("RDF"). The mask data preparation 2712 provides the RDF to the mask fabrication 2714. The mask fabrication 2714 includes a mask writer (not shown) that converts the RDF to an image on a substrate, such as a mask (reticle) 2716 on a semiconductor wafer. The IC design layout diagram 2710 is manipulated by the mask data preparation 2712 to comply with particular characteristics of the mask writer and/or requirements of the IC fab 2706. In FIG. 27, the mask data preparation 2712 and the mask fabrication 2714 are illustrated as separate elements. In some embodiments, the mask data preparation 2712 and the mask fabrication 2714 can be collectively referred to as a mask data preparation.

In some embodiments, the mask data preparation 2712 includes an optical proximity correction (OPC) that uses lithography enhancement techniques to compensate for image errors, such as those that can arise from diffraction, interference, other process effects and the like. The OPC adjusts the IC design layout diagram 2710. In some embodiments, the mask data preparation 2712 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 2712 includes a mask rule checker (MRC) (not shown) that checks the IC design layout diagram 2710 that has undergone processes in OPC with a set of mask creation rules that contain certain geometric and/or connectivity restrictions to ensure sufficient margins, to account for variability in semiconductor manufacturing processes, and the like. In some embodiments, the MRC modifies the IC design layout diagram 2710 to compensate for limitations during the mask fabrication, which may undo part of the modifications performed by OPC in order to meet mask creation rules.

In some embodiments, the mask data preparation 2712 includes lithography process checking (LPC) (not shown) that simulates processing that will be implemented by the IC fab 2706 to fabricate the IC 2708. LPC simulates this processing based on the IC design layout diagram 2710 to create a simulated manufactured device, such as the IC 2708. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, and if the simulated device is not sufficiently close in shape to satisfy design rules, OPC and/or MRC are be repeated to further refine the IC design layout diagram 2710.

It should be understood that the above description of the mask data preparation 2712 has been simplified for the purposes of clarity. In some embodiments, the mask data preparation 2712 includes additional features such as a logic operation (LOP) to modify the IC design layout diagram 2710 according to manufacturing rules. Additionally, the processes applied to the IC design layout diagram 2710 during the mask data preparation 2712 may be executed in a variety of different orders.

After the mask data preparation 2712 and during the mask fabrication 2714, a mask 2716 or a group of masks 2716 are fabricated based on the IC design layout diagram 2710. In some embodiments, the mask fabrication 2714 includes performing one or more lithographic exposures based on the IC design layout diagram 2710. In some embodiments, an electron-beam (e-beam) or a mechanism of multiple e-beams is used to form a pattern on a mask(s) 2716 (photomask or reticle) based on the IC design layout diagram 2710. The mask(s) 2716 can be formed in various technologies. For example, in some embodiments, the mask (s) 2716 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of the mask(s) 2716 includes a transparent substrate (e.g., fused quartz) and an opaque material (e.g., chromium) coated in the opaque regions of the binary mask.

In another example, the mask(s) 2716 is formed using a phase shift technology. In a phase shift mask (PSM) version of the mask(s) 2716, various features in the pattern formed on the phase shift mask are configured to have a proper phase difference to enhance the resolution and imaging quality. In various examples, the phase shift mask can be attenuated PSM or alternating PSM. The mask(s) 2716 generated by the mask fabrication 2714 is used in a variety of processes. For example, a mask(s) 2716 is used in an ion implantation process to form various doped regions in the semiconductor wafer, in an etching process to form various etching regions in the semiconductor wafer, and/or in other suitable processes.

The IC fab 2706 includes wafer fabrication 2718. The IC fab 2706 is an IC fabrication business that includes one or more manufacturing facilities for the fabrication of a variety of different IC products. In some embodiments, the IC fab 2706 is a semiconductor foundry. For example, there may be a manufacturing facility for the front end fabrication of a plurality of IC products (FEOL fabrication), while a second manufacturing facility may provide the back end fabrication for the interconnection and packaging of the IC products (BEOL fabrication), and a third manufacturing facility may provide other services for the foundry business.

The IC fab 2706 uses the mask(s) 2716 fabricated by the mask house 2704 to fabricate the IC 2708. Thus, the IC fab 2706 at least indirectly uses the IC design layout diagram 2710 to fabricate the IC 2708. In some embodiments, a semiconductor wafer 2720 is fabricated by the IC fab 2706 using the mask(s) 2716 to form the IC 2708. In some embodiments, the IC fab 2706 includes performing one or more lithographic exposures based at least indirectly on the IC design layout diagram 2710. The semiconductor wafer 2720 includes a silicon substrate or other proper substrate having material layers formed thereon. The semiconductor wafer 2720 further includes one or more of various doped regions, dielectric features, multilevel interconnects, and the like (formed at subsequent manufacturing steps).

Figure 28:
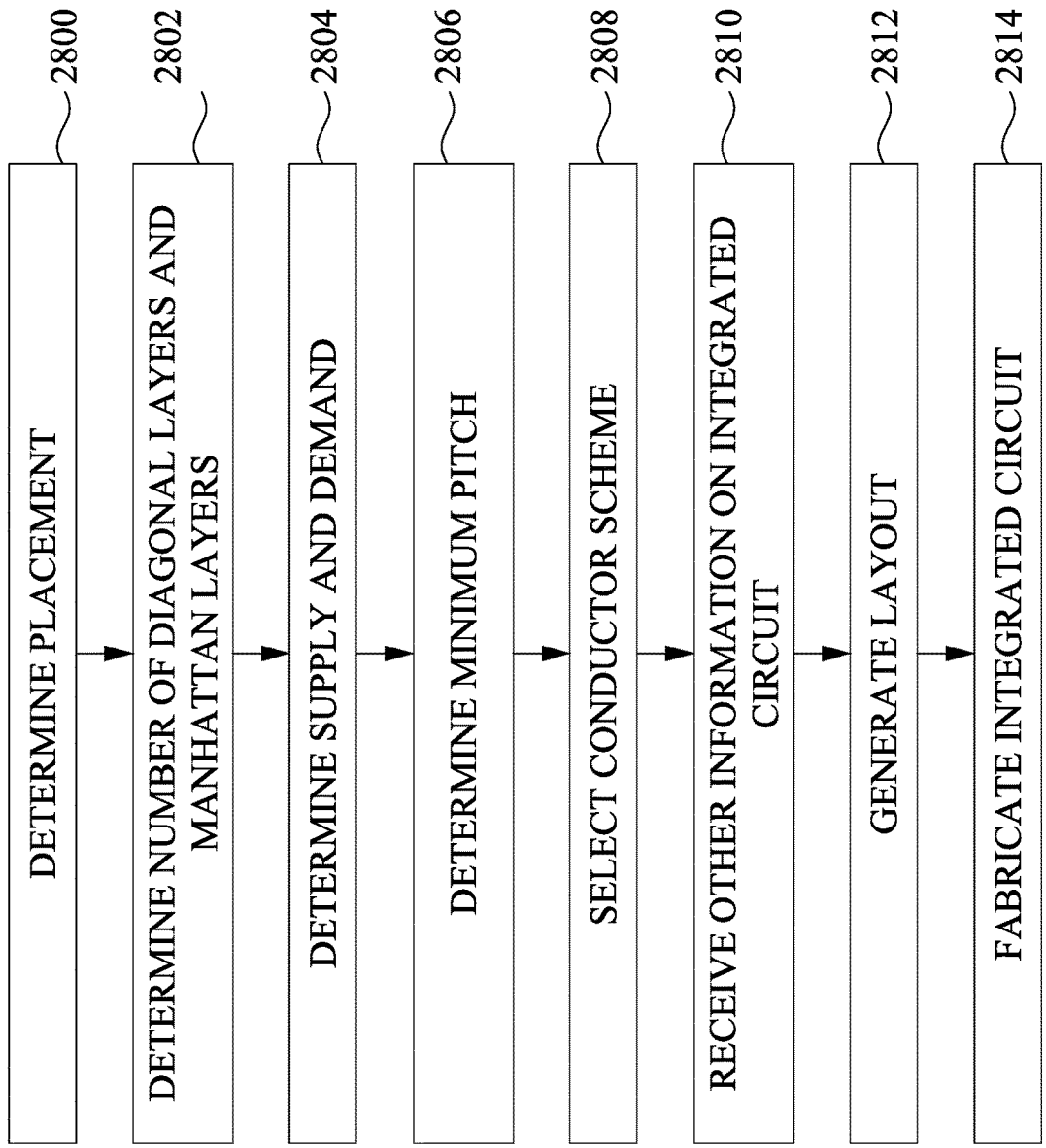
FIG. 28 illustrates an example flowchart of a method of providing an integrated circuit in accordance with some embodiments.

FIG. 28 illustrates an example flowchart of a method of providing an integrated circuit in accordance with some embodiments. Initially, as shown in block 2800, a placement of the circuit(s) and/or the components in the integrated circuit is determined. At block 2802, the number of diagonal layers and the number of Manhattan layers for an integrated circuit are determined. One or more of the embodiments described in conjunction with FIGS. 3-9 can be used in block 2802.

The supply and the demand of the vertical edges, the diagonal edges, and the horizontal edges for each conductor layer (e.g., 3D routing) or for all conductor layers (e.g., 2D global routing) are determined (block 2804). One or more of the embodiments described in conjunction with FIGS. 12-22 can be used in block 2804. A minimum pitch for the horizontal and the vertical tracks and the minimum pitch for the diagonal tracks are determined at block 2806. One or more of the embodiments described in conjunction with FIGS. 23 and 25 can be used in block 2806.

Next, a conductor scheme is selected at block 2808. One of the embodiments described in conjunction with FIGS. 10-11 can be used in block 2808. Other information on the integrated circuit is received at block 2810. The other information is any other suitable information that is used in the design and/or the manufacture of the integrated circuit. The other information can include, but is not limited to, design check rules and the types, number, and placement of the various components and/or circuits in the integrated circuit.

A layout of the integrated circuit is then generated at block 2812. In one embodiment, the layout is produced by a design house (e.g., design house 2702 in FIG. 27). The layout can be represented or defined by an IC design layout diagram (e.g., IC design layout diagram 2710 in FIG. 27). The integrated circuit is then fabricated at block 2814. In one embodiment, the integrated circuit is manufactured using at least the mask house 2704 and an IC fab 2706 as shown and described in conjunction with FIG. 27.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In one aspect, a method of designing an integrated circuit includes a processing device determining a placement of components in the integrated circuit and determining a representation for each respective net in the integrated circuit based on the placement. In one embodiment, the representation is a tree representation. A number of conductor layers to be used for Manhattan routing of conductors is determined, where the determining includes calculating a first ratio for the Manhattan edges in the trees based on a total length of the Manhattan edges or on a total count of the Manhattan edges. A number of conductor layers to be used for diagonal routing of conductors is determined, where the determining comprising calculating a second ratio for the diagonal edges in the trees based on a total length of the diagonal edges or on a total count of the diagonal edges. Based on the first and the second ratios, a conductor scheme for the integrated circuit is selected. A layout of the integrated circuit is then generated.

In another aspect, a system includes a processing device and a memory operably connected to the processing device. The memory stores instructions, that when executed by the processing device, cause operations to be performed. The operations include determining a placement of components in the integrated circuit and determining a representation for each respective net in the integrated circuit based on the placement. In one embodiment, the representation is a tree representation. A number of conductor layers to be used for Manhattan routing of conductors is determined, where the determining includes calculating a first ratio for the Manhattan edges in the trees based on a total length of the Manhattan edges or on a total count of the Manhattan edges. A number of conductor layers to be used for diagonal routing of conductors is determined, where the determining comprising calculating a second ratio for the diagonal edges in the trees based on a total length of the diagonal edges or on a total count of the diagonal edges. Based on the first and the second ratios, a conductor scheme for the integrated circuit is selected. A layout of the integrated circuit is then generated.

In yet another aspect, a method includes a processing device determining a placement of components in the integrated circuit and determining a representation for each respective net in the integrated circuit based on the placement. In one embodiment, the representation is a tree representation. A diagonal edge length is determined for one or more diagonal edges in the representations. A respective diagonal edge is replaced with a Manhattan edge based on a determination that the diagonal edge length of the respective diagonal edge is less than a threshold length. A number of conductor layers to be used for Manhattan routing of conductors is determined, where the determining includes calculating a first ratio for the Manhattan edges in the trees based on a total length of the Manhattan edges or on a total count of the Manhattan edges. A number of conductor layers to be used for diagonal routing of conductors is determined, where the determining comprising calculating a second ratio for the diagonal edges in the trees based on a total length of the diagonal edges or on a total count of the diagonal edges. Based on the first and the second ratios, a conductor scheme for the integrated circuit is selected. A layout of the integrated circuit is then generated.

The description and illustration of one or more aspects provided in this application are not intended to limit or restrict the scope of the disclosure as claimed in any way. The aspects, examples, and details provided in this application are considered sufficient to convey possession and enable others to make and use the best mode of claimed disclosure. The claimed disclosure should not be construed as being limited to any aspect, example, or detail provided in this application. Regardless of whether shown and described in combination or separately, the various features (both structural and methodological) are intended to be selectively included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

What is claimed is:

1. A method of designing an integrated circuit, the method comprising:
    determining, by a processing device, a placement of components in the integrated circuit;
    determining, by the processing device, a tree for each respective net in the integrated circuit based on the placement;
    determining, by the processing device, a number of conductor layers to be used for Manhattan routing of conductors, the determining comprising calculating a first ratio for Manhattan edges in the trees;
    determining, by the processing device, a number of conductor layers to be used for diagonal routing of conductors, the determining comprising calculating a second ratio for diagonal edges in the trees;
    selecting, by the processing device, a conductor scheme for the integrated circuit based on the first and the second ratios; and
    producing a layout of the integrated circuit.

2. The method of claim 1, further comprising fabricating the integrated circuit based on the layout of the integrated circuit.

3. The method of claim 1, wherein calculating the first ratio for the Manhattan edges in the trees comprises:
    determining a total Manhattan edge length for the Manhattan edges;
    determining a total edge length, the total edge length including the total Manhattan edge length for the Manhattan edges and a total diagonal edge length for the diagonal edges; and
    determining the first ratio based on the total Manhattan edge length for the Manhattan edges divided by the total edge length.

4. The method of claim 3, wherein:
    the method further comprises applying, prior to determining the total edge length, a weight to the diagonal edges that have a length that is less than a threshold length; and the total edge length includes the total Manhattan edge length for the Manhattan edges and the total diagonal edge length for the diagonal edges that is comprised of a first total diagonal edge length for the diagonal edges that have a length greater than the threshold length, and a second total diagonal edge length of weighted lengths of the diagonal edges that have a length less than the threshold length.

5. The method of claim 1, wherein calculating the second ratio for the diagonal edges in the trees comprises:
   determining a total diagonal edge length for the diagonal edges;
   determining a total edge length, the total edge length including a total Manhattan edge length for the Manhattan edges and the total diagonal edge length for the diagonal edges; and
   determining the second ratio based on the total diagonal edge length for the diagonal edges divided by the total edge length.

6. The method of claim 5, wherein:
   the method further comprises applying, prior to determining the total diagonal edge length for the diagonal edges, a weight to the diagonal edges that have a length that is less than a threshold length; and
   the total edge length includes the total Manhattan edge length for the Manhattan edges and the total diagonal edge length for the diagonal edges that is comprised of a first total diagonal edge length for the diagonal edges that have a length greater than the threshold length, and a second total diagonal edge length of the weighted lengths of the diagonal edges that have a length less than the threshold length.

7. The method of claim 1, wherein calculating the first ratio for the Manhattan edges in the trees comprises:
   determining a total Manhattan edge count for the Manhattan edges;
   determining a total edge count, the total edge count including the total Manhattan edge count for the Manhattan edges and a total diagonal edge count for the diagonal edges; and
   determining the first ratio based on the total Manhattan edge count for the Manhattan edges divided by the total edge count.

8. The method of claim 1, wherein calculating the second ratio for the diagonal edges in the trees comprises:
   determining a total diagonal edge count for the diagonal edges;
   determining a total edge count, the total edge count including a total Manhattan edge count for the Manhattan edges and the total diagonal edge count for the diagonal edges; and
   determining the second ratio based on the total diagonal edge count for the diagonal edges divided by the total edge count.

9. The method of claim 8, further comprising applying, prior to determining the total edge count, a weight to the total diagonal edge count for the diagonal edges to produce a weighted diagonal edge count for the diagonal edges when the total diagonal edge count is less than a threshold count, wherein the total edge count includes a total Manhattan edge count for the Manhattan edges and the weighted total diagonal edge count for the diagonal edges.

10. The method of claim 1, further comprising:
    partitioning, by the processing device, a design into bins after selecting the conductor scheme, the design comprising one of a design for the integrated circuit or a design for a conductor layer in the integrated circuit;
    applying, by the processing device, rectangles for the Manhattan edges;
    applying, by the processing device, rectangles for the diagonal edges; and
    determining, by the processing device a demand for the Manhattan edges and for the diagonal edges.

11. A system, comprising:
    a processing device; and
    a memory operably connected to the processing device and storing instructions, that when executed by the processing device, cause operations to be performed, the operations comprising:
        determining a placement of components in an integrated circuit;
        determining a tree for each respective net in the integrated circuit based on the placement;
        determining a number of conductor layers to be used for Manhattan routing of conductors, the determining comprising calculating a first ratio for Manhattan edges in the trees;
        determining a number of conductor layers to be used for diagonal routing of conductors, the determining comprising calculating a second ratio for diagonal edges in the trees;
        selecting a conductor scheme for the integrated circuit based on the first and the second ratios; and
        generating a layout of the integrated circuit.

12. The system of claim 11, wherein calculating the first ratio for the Manhattan edges in the trees comprises:
    determining a total Manhattan edge length for the Manhattan edges;
    determining a total edge length, the total edge length including the total Manhattan edge length for the Manhattan edges and a total diagonal edge length for the diagonal edges; and
    determining the first ratio based on the total Manhattan edge length for the Manhattan edges divided by the total edge length.

13. The system of claim 11, wherein calculating the second ratio for the diagonal edges in the trees comprises:
    determining a total diagonal edge length for the diagonal edges;
    determining a total edge length, the total edge length including a total Manhattan edge length for the Manhattan edges and the total diagonal edge length for the diagonal edges; and
    determining the second ratio based on the total diagonal edge length for the diagonal edges divided by the total edge length.

14. The system of claim 11, wherein calculating the first ratio for the Manhattan edges in the trees comprises:
    determining a total Manhattan edge count for the Manhattan edges;
    determining a total edge count, the total edge count including the total Manhattan edge count for the Manhattan edges and a total diagonal edge count for the diagonal edges; and
    determining the first ratio based on the total Manhattan edge count for the Manhattan edges divided by the total edge count.

15. The system of claim 11, wherein calculating the second ratio for the diagonal edges in the trees comprises:
    determining a total diagonal edge count for the diagonal edges;

determining a total edge count, the total edge count including a total Manhattan edge count for the Manhattan edges and the total diagonal edge count for the diagonal edges; and determining the second ratio based on the total diagonal edge count for the diagonal edges divided by the total edge count.

16. The system of claim 15, wherein the memory stores further instructions for applying, prior to determining the total diagonal edge count for the diagonal edges, a weight to the total diagonal edge count for the diagonal edges to produce a weighted total diagonal edge count for the diagonal edges when the total diagonal edge count is less than a threshold count, wherein the total edge count includes a total Manhattan edge count for the Manhattan edges and the weighted total diagonal edge count for the diagonal edges.

17. The system of claim 11, wherein the memory stores further instructions for:

after selecting the conductor scheme, partitioning, by the processing device, a design into bins;

applying, by the processing device, rectangles for the Manhattan edges;

applying, by the processing device, rectangles for the diagonal edges; and determining, by the processing device a demand for the Manhattan edges and for the diagonal edges.

18. A method, comprising:

determining, by a processing device, a placement of components in an integrated circuit;

determining, by the processing device, a tree for each respective net in the integrated circuit based on the placement;

determining, by the processing device, a diagonal edge length for one or more diagonal edges in the trees;

determining the diagonal edge length for a respective diagonal edge is less than a threshold length and replacing the respective diagonal edge with a Manhattan edge;

determining, by the processing device, a number of conductor layers to be used for Manhattan routing of conductors, the determining comprising calculating a first ratio for Manhattan edges in the trees based on a total edge length of the Manhattan edges;

determining, by the processing device, a number of conductor layers to be used for diagonal routing of conductors, the determining comprising calculating a second ratio for diagonal edges in the trees based on a total edge length of the diagonal edges;

selecting, by the processing device, a conductor scheme for the integrated circuit based on the first and the second ratios; and generating a layout of the integrated circuit.

19. The method of claim 18, further comprising fabricating the integrated circuit based at least on the layout.

20. The method of claim 18, further comprising:

partitioning, by the processing device, a design into bins after selecting the conductor scheme, the design comprising one of a design for the integrated circuit or a design for a conductor layer in the integrated circuit;

applying, by the processing device, rectangles for the Manhattan edges;

applying, by the processing device, rectangles for the diagonal edges; and determining, by the processing device a demand for the Manhattan edges and for the diagonal edges.

* * * * *